(12) United States Patent
Aldrich et al.

(10) Patent No.: US 6,266,266 B1
(45) Date of Patent: Jul. 24, 2001

(54) INTEGRATED CIRCUIT DESIGN EXHIBITING REDUCED CAPACITANCE

(75) Inventors: Lawrence Lee Aldrich; Kim Carver Hardee, both of Colorado Springs, CO (US)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/652,824

(22) Filed: Aug. 31, 2000

Related U.S. Application Data

(63) Continuation-in-part of application No. 09/595,143, filed on Jun. 16, 2000.

(51) Int. Cl.[7] .................................................... G11C 5/06
(52) U.S. Cl. ................... 365/63; 365/51; 257/758
(58) Field of Search .................................. 365/51, 63, 52; 257/750, 758, 759, 760

(56) References Cited

U.S. PATENT DOCUMENTS

| | | | | |
|---|---|---|---|---|
| 5,537,346 | * | 7/1996 | Seo et al. ................................ | 365/51 |
| 5,687,108 | * | 11/1997 | Proebsting ............................. | 365/51 |
| 5,748,550 | * | 5/1998 | Jeon et al. ............................ | 365/226 |

* cited by examiner

Primary Examiner—Son Mai
(74) Attorney, Agent, or Firm—Cook, Alex, McFarron, Manzo, Cummings & Mehler, Ltd.

(57) ABSTRACT

A reduced capacitance architecture for integrated circuits and particularly for memory integrated circuits is disclosed. The integrated circuit has a plurality of levels including first and second levels. A first signal conductor extends within the first level. A second signal conductor also extends within the first level and is positioned adjacent to and in close proximity with the first signal conductor. The second level is positioned adjacent to the first level and includes a third signal conductor extending within it. The third signal conductor is positioned laterally between the first and second conductors to eliminate vertical parallel plate capacitance.

30 Claims, 15 Drawing Sheets

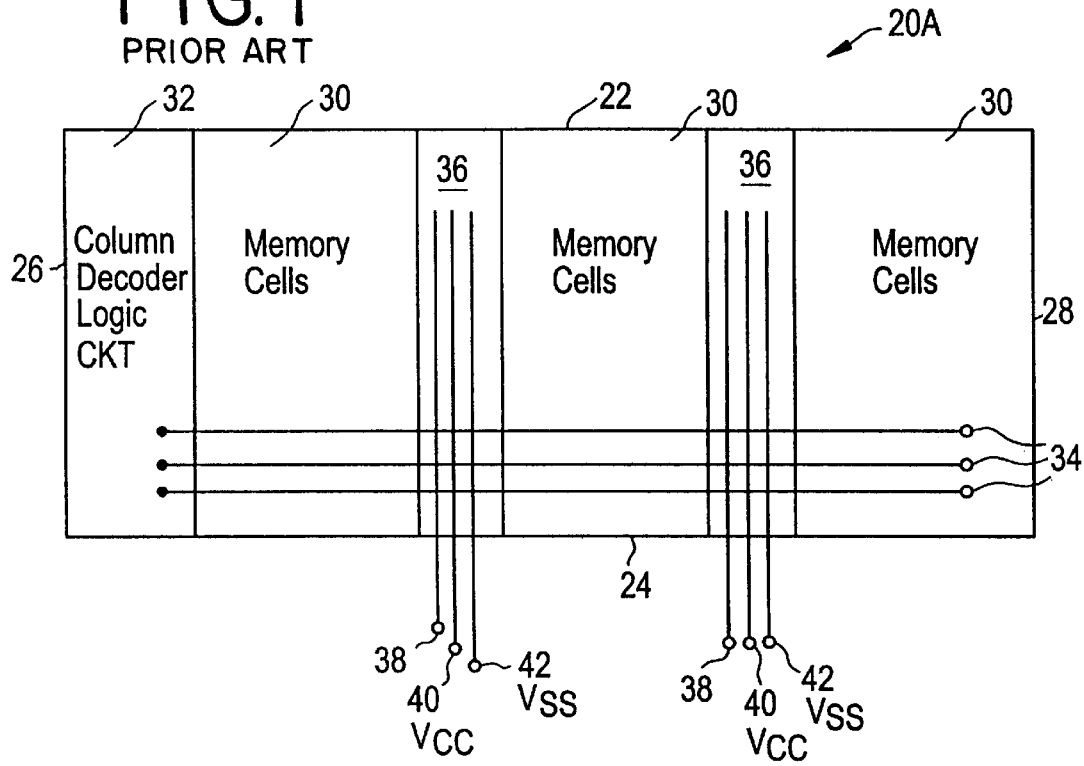
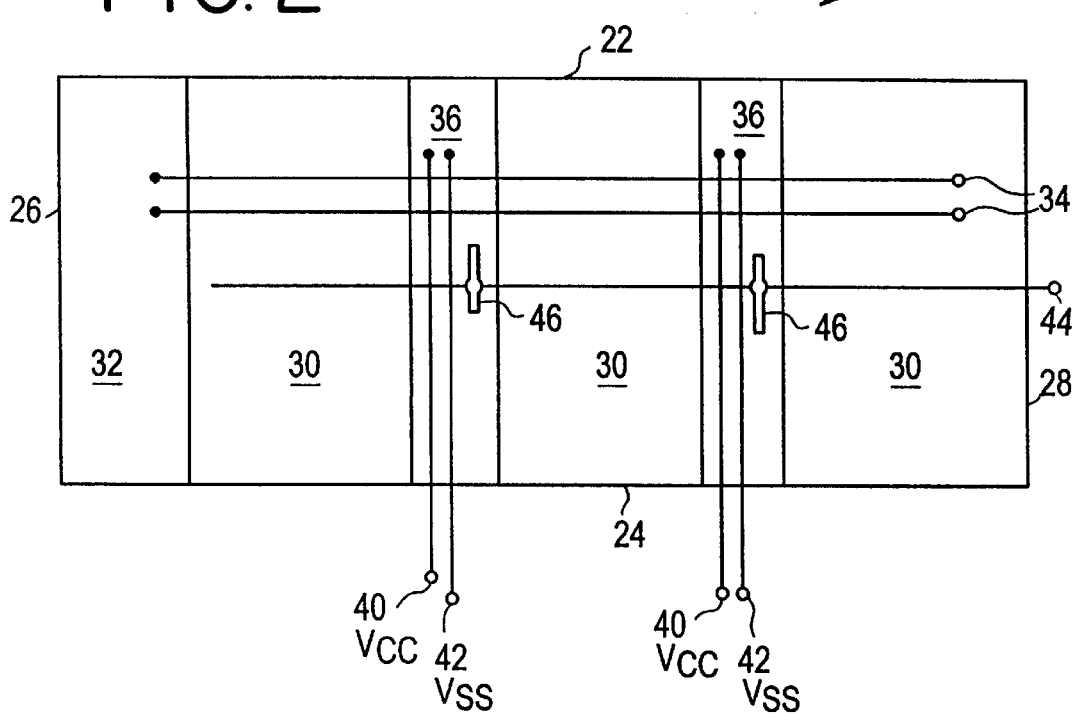

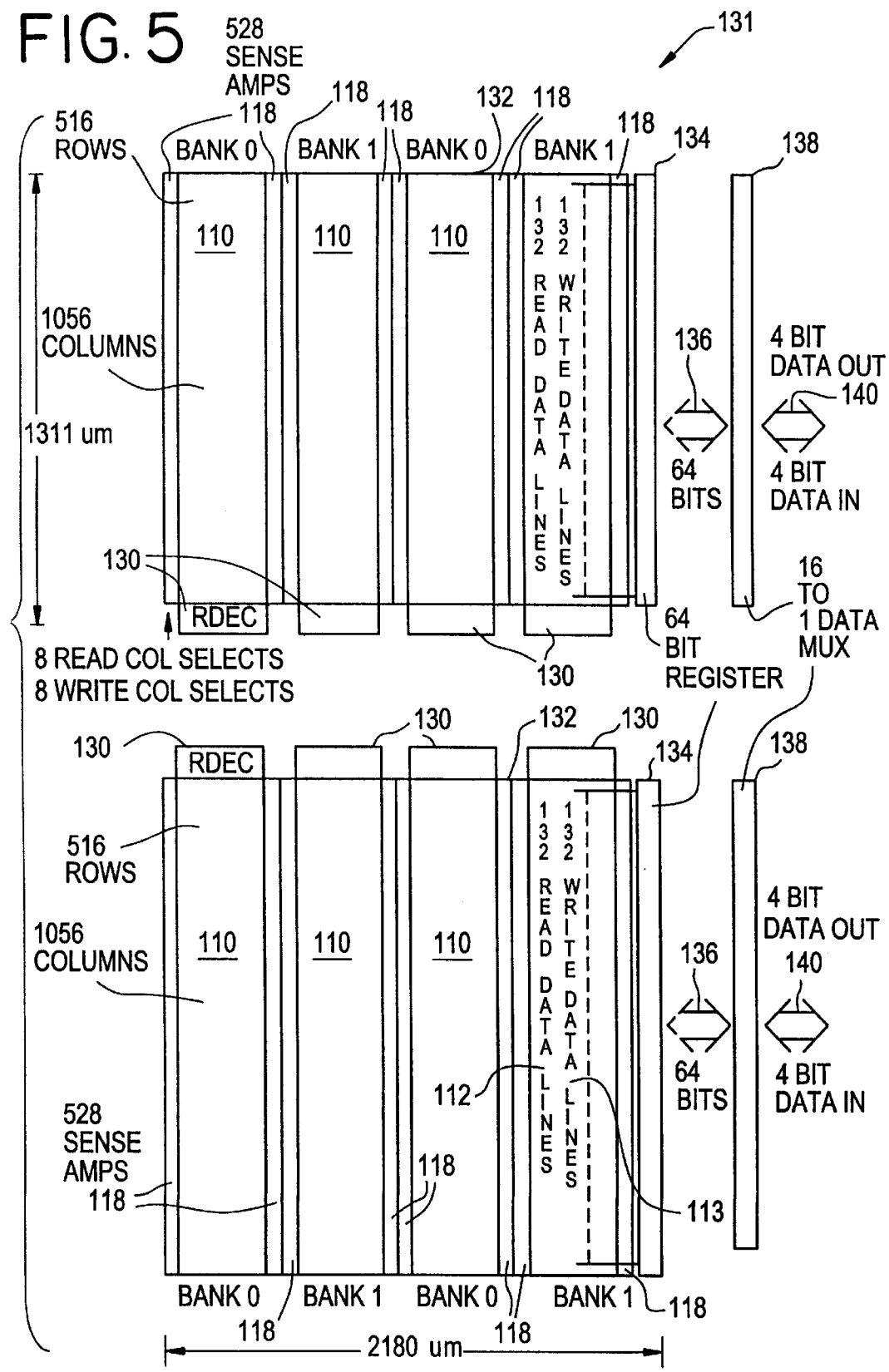

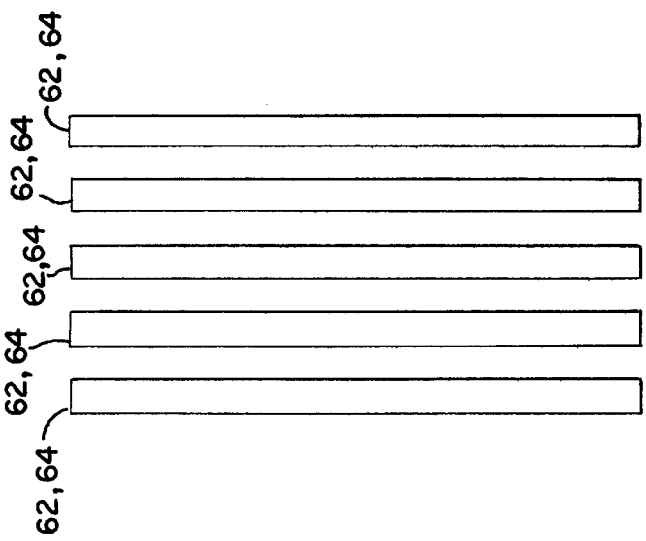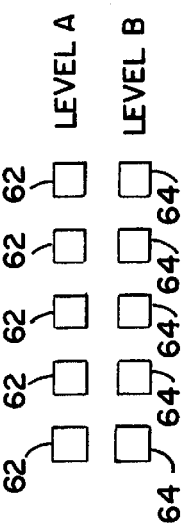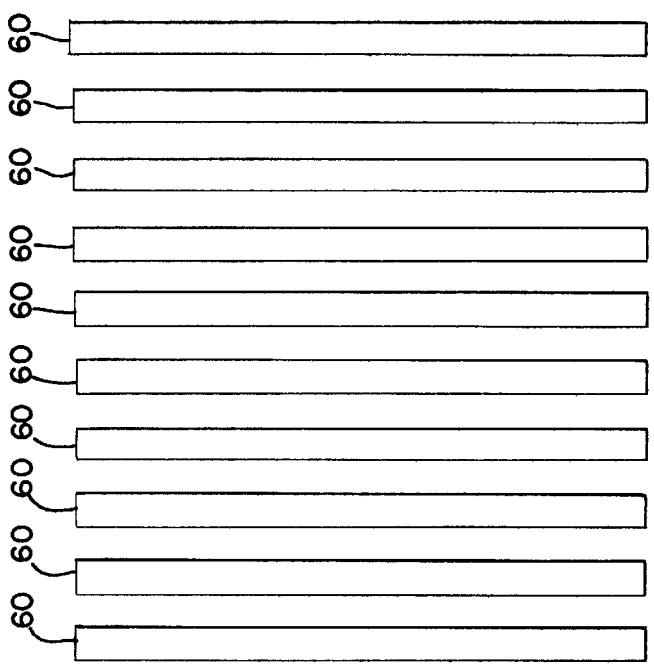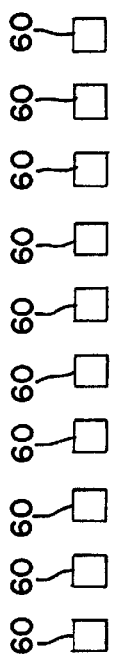

INTEGRATED CIRCUIT DESIGN EXHIBITING REDUCED CAPACITANCE

CROSS-REFERENCE TO RELATED APPLICATION

This application is a continuation-in-part of U.S. Ser. No. 09/595,143, filed Jun. 16, 2000, entitled "Architecture for High Speed Memory Circuit Having a Relatively Large Number of Internal Data Lines", Attorney Docket No. UM-137, naming Kim Carver Hardee and John Heightley as inventors.

FIELD OF THE INVENTION

The present invention relates to integrated circuits and particularly to integrated circuits having reduced line capacitance.

BACKGROUND OF THE INVENTION

Read/write memory integrated circuits store data by a process called writing and permit the subsequent retrieval of that data by a process called reading. In a conventional memory circuit, data is stored in a plurality of storage locations arranged as an array of memory cells. Each storage location is identified by an address, which might include both a row identifier and a column identifier. The amount of data that can be stored in the cells of a memory integrated circuit is known as the storage capacity of the circuit. In conventional memory circuits, internal data lines transfer the data to the storage locations during a write cycle and transfer the data from the storage locations during a read cycle.

One specific type of memory circuit is known as a random access memory circuit ("RAM"). Random access memory circuits permit the storage locations to be accessed randomly, and further permit data to be both read from and written to the storage locations of the memory circuit. RAM circuits generally come in two forms. The first form of RAM is known as a static RAM circuit ("SRAM"). A primary characteristic of an SRAM circuit is that the circuit uses latches so that the storage locations of the circuit indefinitely retain the data stored therein, provided power is connected to the circuit. The second form of RAM is known as a dynamic RAM circuit ("DRAM"). A primary characteristic of a DRAM circuit is that the circuit uses charge storing elements, such as capacitors, to retain the stored data in the storage locations, and the circuit must periodically recharge (i.e., refresh) the data in order to retain same.

As will be appreciated by those skilled in the art, prior art memory integrated circuits that require a large number of internal data lines typically have high power requirements, have relatively slow speed, and have generally high power and ground line resistance. This high resistance generates undesirable power supply and ground noise, which limits the speed of the circuits.

Although the present invention shall be shown and described in the form of an embedded DRAM macro, those skilled in the art will appreciate that the principles of the present invention are applicable to memory integrated circuits generally, and more particularly to high speed memory integrated circuits requiring a large number of internal data lines.

Throughout this specification, reference will often be made to inputs, outputs, lines and busses, among other things, that are included within the preferred form of the memory integrated circuit. Throughout this specification, if reference is made to one of these, such as a data line, and that data line is given a particular reference numeral for identification purposes, then another data line given the same reference numeral but with a "B" designation shall be understood to be its complement. For instance, a data line 300B would be understood to be the complement of data line 300. Conversely, data line 300 would be the complement of data line 300B. Generally speaking, if they are not tied together (such as when they are equalized), or if they are not driven to the same logic state for a special purpose, when data line 300 is HIGH, data line 300B is LOW. Conversely, absent special conditions, when data line 300 is LOW, data line 300B is HIGH. Those skilled in the art will appreciate this concept and understand this designation hereby incorporated herein by reference.

FIG. 1 illustrates the architecture for a conventional DRAM memory macro. In particular, FIG. 1 shows an embedded DRAM macro 20A having a first laterally extending boundary 22 and an associated laterally extending boundary 24 defining an opposite side thereof. Macro 20A further includes two opposing longitudinally extending boundaries 26, 28. DRAM macro 20A includes a plurality of memory cell arrays or banks 30, each of which includes a plurality of memory cells (i.e., storage locations). Each memory cell has a unique row and column address for identification purposes.

Column decoder logic circuitry 32 is positioned along the length of, and in close proximity to, boundary 26. As shown, several column select lines 34 extend laterally from column decoder 32 across macro 20A and over memory cell banks 30.

Longitudinally extending bands 36 separate adjacent memory cell banks 30. Bands 36 each include a plurality of sense amplifiers (not shown). For this reason, bands 36 are generally referred to as sense amp bands by those skilled in the art. As shown in FIG. 1, in conventional DRAM macros, data lines 38, power lines 40 and ground lines 42 extend longitudinally across macro 20A through sense amp bands 36. Power lines 40 are generally set at a voltage referred to as Vcc by those skilled in the art, and ground lines 42 are generally set at a voltage referred to as Vss by those skilled in the art.

As just described, in this conventional architecture, the data lines 44 and the power and ground lines 40, 42 run through the sense amp bands 36. Further, the column select lines 34 typically run across the memory arrays 30 in a direction generally transverse to the data lines. Although suitable for a variety of applications, this conventional architecture for macro 20A is not suited for memory circuits having a large number of internal data lines 38. In particular, only a small number of data lines, perhaps only two to four data lines, can run through each sense amp band 36. This limitation is due to chip area considerations and the consequential limited width of the sense amp bands 36. In addition, with respect to this conventional architecture, the power and ground lines 40, 42 have a relatively high resistance. Notably, because they run through the sense amp bands, the power and ground lines must be relatively narrow, which, in turn, causes them to have a relatively high resistance.

FIG. 2 illustrates a DRAM macro architecture that would accommodate a relatively large number of internal data lines. The DRAM macro architecture shown in FIG. 2 would include global data lines 44 extending laterally across macro 20B and over the memory arrays 30, in a direction generally transverse to the sense amp bands 36, which extend longitudinally across the macro. Macro 20B would further include local data lines 46 that extend longitudinally through the sense amp bands 36 and connect with the global data lines 44. Each of these local data lines 46 would be shared by a predetermined set of the sense amplifiers contained within sense amp bands 36. Each local data line 46 would be associated with exactly one set of sense amplifiers. Further, each set of sense amplifiers would be associated with exactly only one local data line 46.

During a read operation, a selected one of the sense amplifiers in one of the sets of sense amplifiers would be enabled by a signal present on its associated column select line 34. Thereafter, the data stored in the memory cell associated with that selected sense amplifier would be transferred to the local data line 46 connected to that selected sense amplifier. The data then, in turn, would be transferred to a global data line 44 connected to that local data line 46 for subsequent processing by circuit elements positioned external to macro 20B.

During a write operation, data would be sent from an external circuit element (e.g., microprocessor) to the memory macro 20B for storage at an address therein. The data first would be transferred from a global data line 44 to a local data line 46 connected thereto. A selected one of the sense amplifiers in one of the sets of sense amplifiers would be enabled by a signal present on its associated column select line 34. Thereafter, the data present on the local data line 46 connected to the selected sense amplifier would be transferred to the memory cell associated with that selected sense amplifier for storage in the memory array 30 at that storage location.

Although the architecture shown in FIG. 2 would allow for a large number of internal data lines without requiring any area penalty, it would have two notable disadvantages. First, the capacitance of the global data lines 46 would be relatively high, which would decrease performance and increase power consumption. Second, because they would run through the sense amp bands 36, which have a limited width, the power and ground lines 40, 42 would be relatively narrow. As explained above, this would cause them to have undesirably high resistance.

Referring now to another architecture shown in FIG. 3, a macro 20C shown therein would include: column select lines 34 extending laterally across the macro and over the memory arrays 30, global data lines 44 extending in that same direction, local data lines 46 extending longitudinally through the sense amp bands 36, and a plurality of power and ground lines 40, 42. Some of the power and ground lines 40, 42 would extend laterally across the array, while others would extend longitudinally through the sense amp bands 36. Those power and ground lines 40, 42 that would extend laterally across macro 20C could be of larger width than those described above. Furthermore, in this architecture, those power and ground lines 40, 42 that would extend longitudinally through the sense amp bands 36 would increase the effective width of the power and ground bussing. Accordingly, the power and ground bussing that would be utilized in this architecture would have reduced resistance, thereby reducing power consumption and ground noise.

Nevertheless, the architecture for macro 20C shown in FIG. 3 would not be optimal for high speed memory integrated circuits requiring a large number of internal data lines. In particular, because its column select lines 34, global data lines 44, and power and ground lines 40, 42 would extend laterally across macro 20C, space considerations would limit the ability to fit the macro in a small chip. As a practical matter, it would be necessary to add additional layers of metal to accommodate all of the laterally extending lines of this architecture. This addition of metal layers would add to the manufacturing cost of the memory circuit and would also increase the capacitance of the column select lines 34 and the global data lines 44, which would decrease performance and increase power consumption.

FIGS. 15A and 15B illustrate a conventional layout for generally parallel signal conductors in integrated circuits. In this depicted conventional layout, a plurality of generally parallel signal conductors designated 60 extend in generally the same direction. There are ten conductors shown in FIGS. 15A and 15B. Conductors 60 are all included within the same level. This depicted layout is useful for certain, limited purposes. However, this layout results in an inefficient use of chip space, particularly when a high number of conductors 60 are present in a particular circuit design. In the memory circuit disclosed herein, conductors 60 could represent the read and/or write data lines. As will be appreciated, when a relatively high number of internal data lines are used, the layout depicted in FIGS. 15A and 15B is inefficient.

FIGS. 16A and 16B illustrate another conventional layout for generally parallel signal conductors in integrated circuits. In this depicted conventional layout, a first set of generally parallel signal conductors 62 is included within a first level designated A and a second set of generally parallel signal conductors 64 is included within a second level designated B. As shown, the conductors 62, 64 are interleaved on different levels. As will be appreciated by those skilled in the art, the layout illustrated in FIGS. 16A and 16B is much more efficient than the layout illustrated in FIGS. 15A and 15B. Nevertheless, because the conductors 62 of the first set on level A are coincident and vertically overlapping the conductors 64 of the second set on level B, a vertical capacitance comprising both a vertical parallel plate capacitance and a vertical fringe capacitance exists on the conductors, which translates into slower signal propagation speed. The utilization of adjacent levels also contributes to the vertical capacitance to reduce performance.

In light of the foregoing, it will be appreciated by those skilled in the art that the architecture generally used with conventional memory circuits is unsuitable for a memory circuit exhibiting reduced power and ground bussing resistance, and reduced data line capacitance. It will also be understood that that architecture is unsuitable for a memory circuit requiring a large number of internal data lines. Furthermore, it will be appreciated by those skilled in the art that many of the possible architectures for such memory circuits, although suitable for limited applications, would have considerable drawbacks that would limit their use in electronic devices. Some of these drawbacks include lesser performance (slower speed), high power consumption and increased manufacturing cost.

One object of an illustrated embodiment is that it provides for a high speed memory circuit having a relatively large number of internal data lines.

Another object of an illustrated embodiment is that it provides for relatively low capacitance on its internal data lines, which permits faster data transfer speed and requires less power.

Still another object of an illustrated embodiment is that it has relatively low resistance power and ground bussing.

Yet another object of an illustrated embodiment is that it has separate read and write data path circuits.

Another object of an illustrated embodiment is that it provides for an integrated circuit design having reduced capacitance.

These and other objects of the illustrated embodiments will become apparent from the following description. It will be understood, however, that an apparatus could still appropriate the invention claimed herein without accomplishing each and every one of these objects, including those gleaned from the following description. The appended claims, not the objects, define the subject matter of this invention. Any and all objects are derived from the illustrated embodiments, not necessarily the invention in general.

SUMMARY OF THE INVENTION

The present invention is directed to a reduced capacitance architecture for integrated circuits and particularly for memory integrated circuits. The integrated circuit has a plurality of levels including first and second levels. A first signal conductor extends within the first level. A second signal conductor also extends within the first level and is positioned adjacent to and in close proximity with the first signal conductor. The second level is positioned adjacent to the first level and includes a third signal conductor extending within it. The third signal conductor is positioned laterally between the first and second conductors to eliminate vertical parallel plate capacitance.

BRIEF DESCRIPTION OF THE DRAWINGS

In describing the preferred embodiment of the present invention, reference has and will be made to the accompanying drawings wherein like parts have like reference numerals, and wherein:

FIG. 1 is a diagrammatic view of the architecture for a conventional memory integrated circuit;

FIG. 2 is a diagrammatic view of an architecture for a memory integrated circuit that would solve one of the problems associated with conventional memory circuits;

FIG. 5 is a different diagrammatic view of the architecture for the memory integrated circuit shown in FIG. 4;

FIG. 15A is a diagrammatic top view of a conventional layout for generally parallel signal conductors included within an integrated circuit;

FIG. 15B is a diagrammatic cut away end view of the conventional layout for generally parallel signal conductors included within an integrated circuit shown in FIG. 15A;

FIG. 16A is a diagrammatic top view of a conventional layout for generally parallel signal conductors included within an integrated circuit;

FIG. 16B is a diagrammatic cut away end view of the conventional layout for generally parallel signal conductors included within an integrated circuit shown in FIG. 16A;

DETAILED DESCRIPTION OF THE PREFERRED EMBODIMENTS

Figure 3:
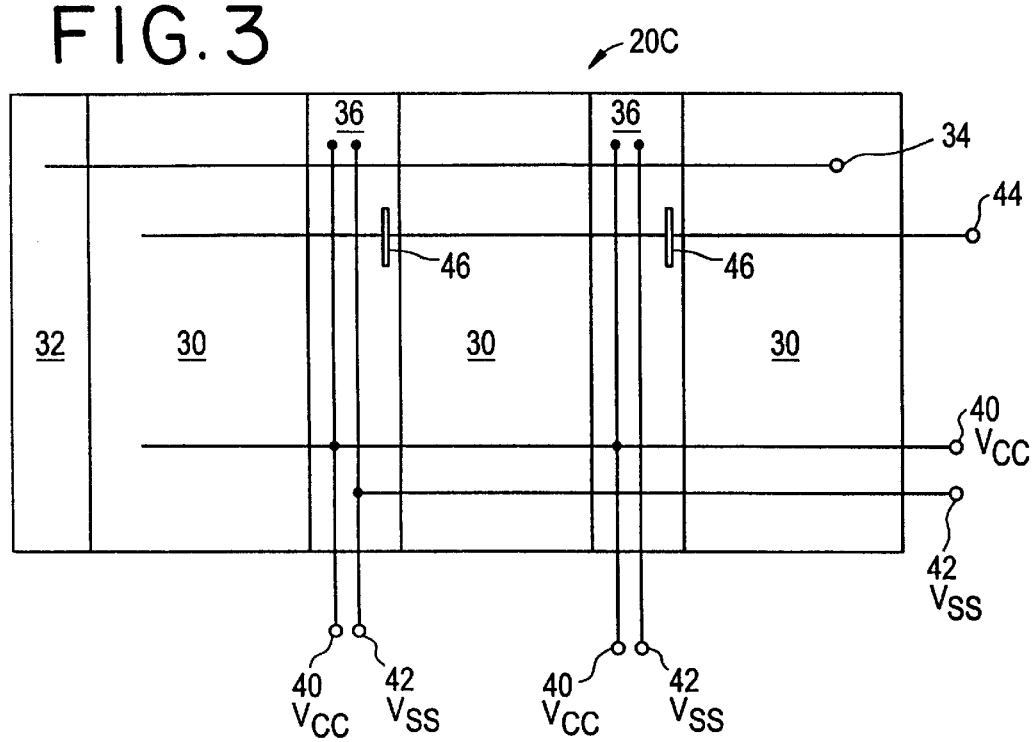
FIG. 3 is a diagrammatic view of another architecture for a memory integrated circuit that would solve a few of the problems associated with conventional memory circuits.
Figure 4:
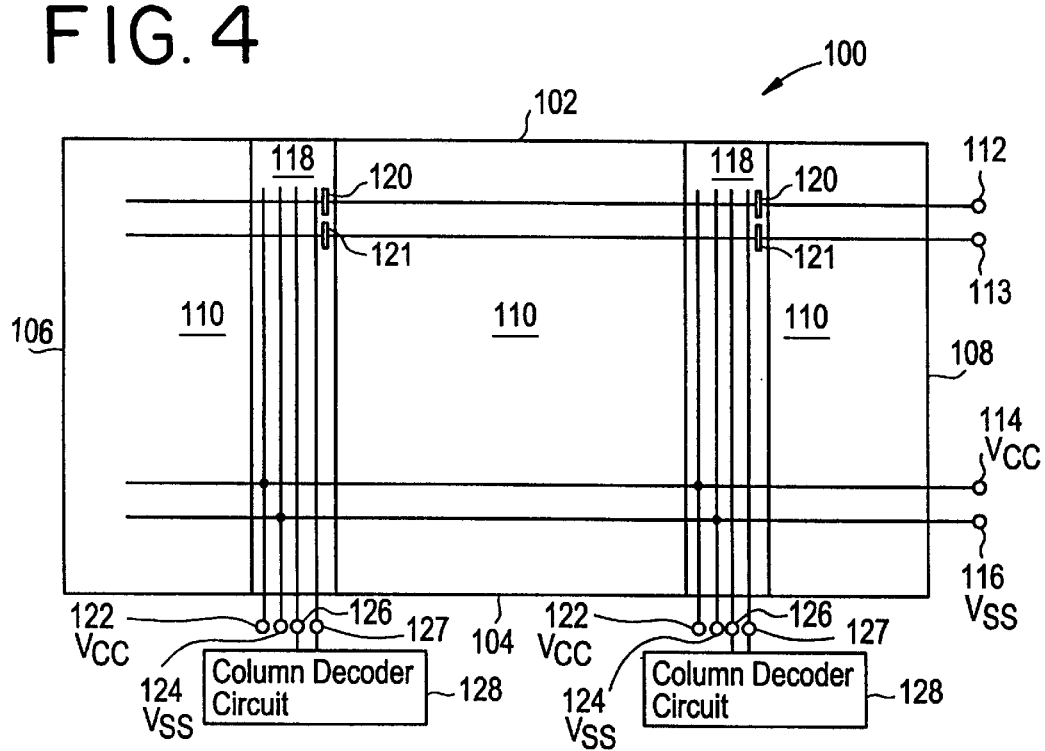
FIG. 4 is a diagrammatic view of the architecture for a memory integrated circuit designed in accordance with the principles of the present invention.

FIG. 4 illustrates an architecture for a high speed DRAM memory array that includes a relatively large number of internal data lines and is organized according to various aspects of the present invention. It will be appreciated that the disclosed memory array may be replicated to form a memory area of a DRAM or other memory. In addition to the array, the memory area would be surrounded by the so-called "peripheral area" of the chip containing, for example, input and output buffers, address buffers, power supplies, pin connections, any substrate bias circuitry, and other conventional peripheral area circuits.

FIG. 4 shows an embedded DRAM array 100 having a first laterally extending boundary 102 and an associated laterally extending boundary 104 defining an opposite side thereof. Array 100 further includes two opposing longitudinally extending boundaries 106, 108. The DRAM array 100 includes a plurality of memory cell banks 110, each of which includes a plurality of memory cells (i.e., storage locations). Each memory cell has a unique row and column address for identification purposes.

Figure 6A:
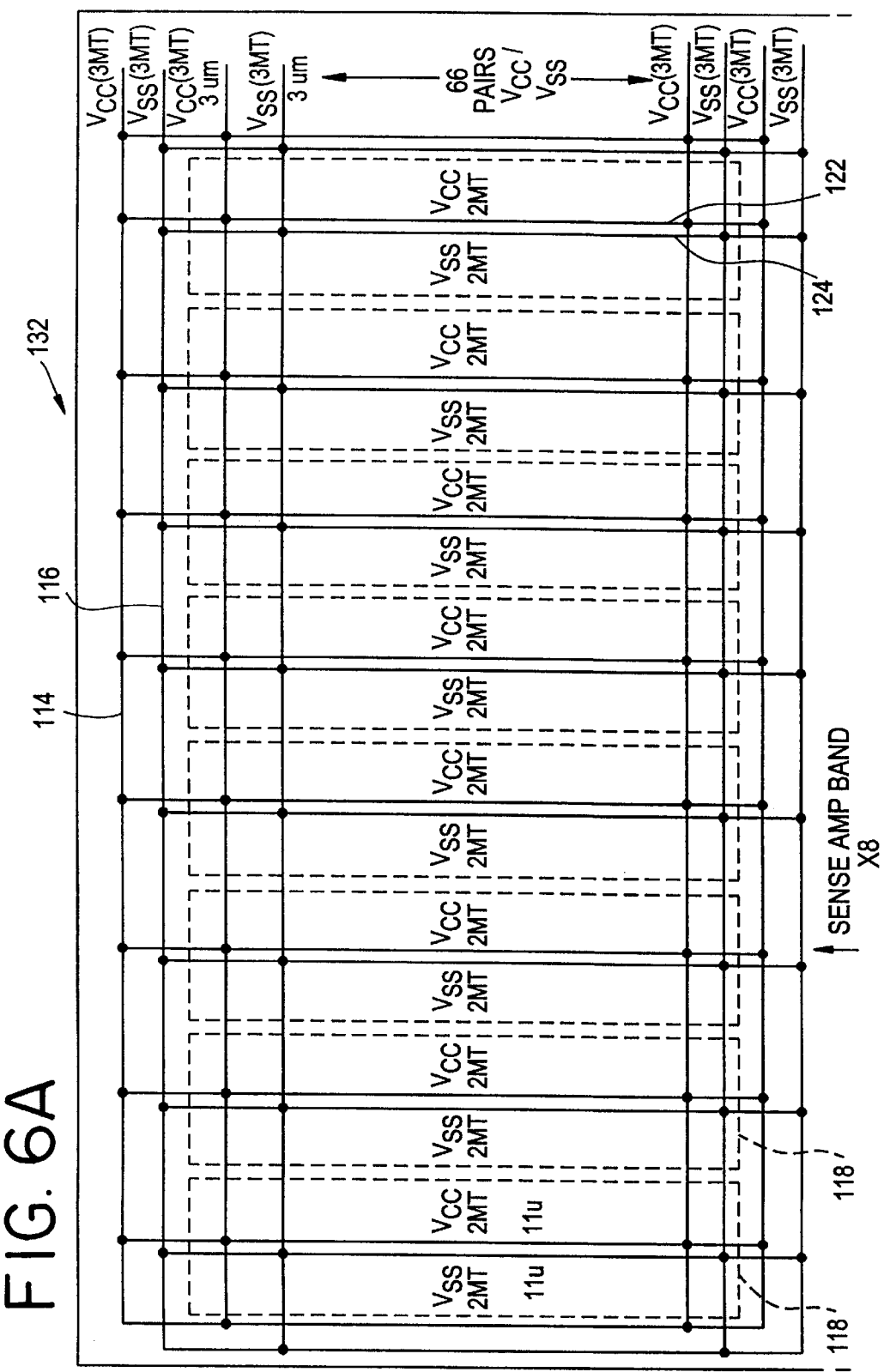
FIG. 6A is a diagrammatic view of the power and ground bussing grid for the memory integrated circuit shown in FIG. 4.
Figure 6B:
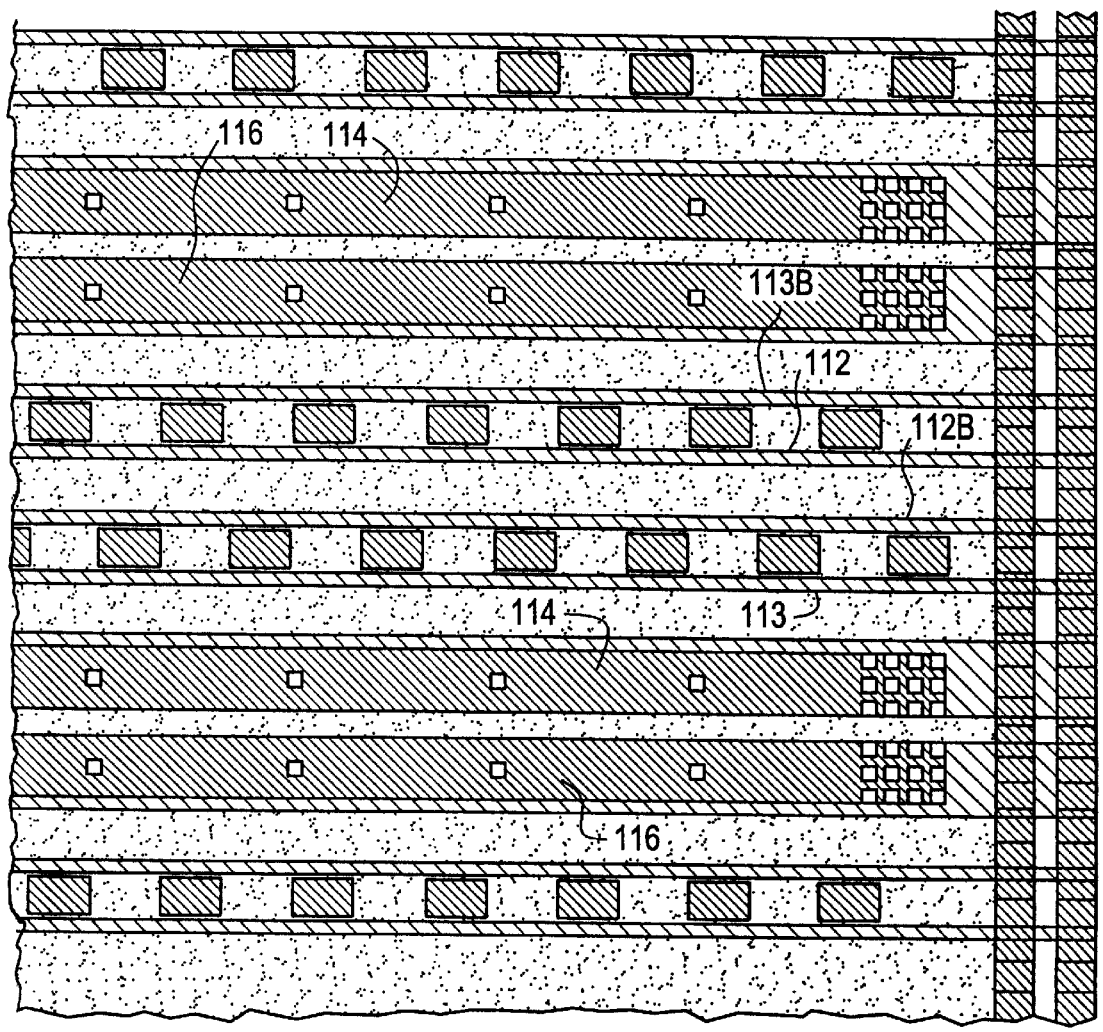
FIG. 6B is a layout view of the global data lines and the power and ground bussing grid for the memory integrated circuit shown in FIG. 4.

Global read and write data lines 112, 113, along with their complements 112B, 113B (see FIG. 7), extend laterally across macro 100. Those lines are preferably, though not necessarily, in the same metal layer, most preferably in a third metal layer ("3MT") (see FIG. 6B). Most preferably, the only other metal interconnect over memory cell banks 110 is in a first metal layer ("1MT"), which is used to strap the word lines (see FIG. 6B). This arrangement provides for global data lines 112, 113 having relatively low capacitance and thereby permits faster data transfer speed and lower power requirements. As will be understood, assuming all three metal layers are present in a given region of array 100, a second metal layer ("2MT") is layered above, but not overlapping, the first metal layer ("1MT"), and the third metal layer ("3MT") is layered above, but not overlapping, the second metal layer. However, as just described and as shown in FIG. 6B, the second metal layer is substantially not present across the memory cell banks 110, which lessens the capacitance of the global read data lines 112, 112B and global write data lines 113, 113B.

Power lines 114 and ground lines 116 also extend laterally across array 100. These lines are also preferably in the 3MT layer (see FIGS. 6A and 6B).

Several sense amp bands 118 extend longitudinally across the array 100 and border the memory cell banks 110. In particular, each memory cell bank 110 includes a sense amp band 118 extending along each of its two longitudinally extending boundaries. Sense amp bands 118 extend generally transverse to the direction that the global read and write data lines 112, 113 and horizontal power and ground lines 114, 116 extend. Sense amp bands 118 include a plurality of sense amplifiers (not shown). Local read and write data lines 120, 121, along with their complements 120B, 121B (see FIG. 7), extend longitudinally through the sense amp bands 118 and connect a plurality of sense amps with a corresponding global read or write data line 112, 113. The local data lines 120, 121 permit the transmission of data between the global data lines 112, 113 and the memory cells of array 100. Each local data line 120, 121 is shared by a predetermined set of the sense amplifiers contained within the sense amp bands 118. Each local data line 120, 121 is associated with exactly one set of sense amplifiers. Further, each set of sense amplifiers is associated with exactly one local data line 120, 121.

Power lines 122 and ground lines 124 also extend longitudinally through the sense amp bands 118. These longitudinally extending power and ground lines 122, 124 are preferably, though not necessarily, in a different metal layer than the metal layer of their counterpart laterally extending power and ground lines 114, 116 (see FIGS. 6A and 6B). The longitudinally extending power and ground lines 122, 124 are most preferably in a second metal layer ("2MT") (see FIG. 6B). The laterally extending power and ground lines 114, 116 are shunted to respective longitudinally extending power and ground lines 122, 124 to form a relatively low resistance power and ground bussing grid, as shown in FIGS. 6A and 6B.

Read column select lines 126 and write column select lines 127 also extend longitudinally through the sense amp bands 118. Each column select line 126, 127 is connected to multiple sense amps positioned in the sense amp band 118 through which that column select line extends. Each column select line 126, 127 is further connected to column decoder circuits 128. Each column decoder circuit 128 is preferably located at the edge of the array 100 in close proximity to the sense amp band 118 through which its associated column select lines 126, 127 extend.

Array 100 further includes row decoder circuits 130 (see FIG. 5). Each row decoder circuit 130 is associated with a particular memory cell bank 110 and is preferably positioned along a laterally extending boundary thereof.

As implied above, in its preferred form, array 100 designates some of its global data lines as global read data lines 112, while others are designated as global write data lines 113. Similarly, in this preferred form, some of the local data lines are designated as local read data lines 120, while others are designated as local write data lines 121. Furthermore, some of the column select lines are designated as read column select lines 126, while others are designated as write column select lines 127. Thus, in its preferred form, the architecture uses separate read and write data path circuits, which permits writing to one memory cell while simultaneously reading from another memory cell. It should be noted that the complements for each of these lines are also included in array 100.

During a read operation, a selected one of the memory cell banks 110 is enabled by an appropriate signal present on its associated selection line (not shown). Furthermore, a row of memory cells within that enabled bank 110 is selected by an appropriate signal derived from the row decoder circuit 130 associated with that enabled bank. Selected sense amplifiers contained within the sense amp bands 118 bordering the enabled bank 110 are enabled by a signal present on their associated read column select line 126, as derived by the column decoder circuit 128 associated with the enabled bank.

The data stored in the sense amp latch corresponding with the selected row and the selected column is transferred to the local read data line 120 connected to that selected sense amplifier. The data is then, in turn, transferred to a global read data line 112 connected to that local read data line 120 for subsequent processing by circuit elements positioned external to the memory circuit.

During a write operation, data is sent from an external circuit element (e.g., microprocessor) to array 100 for storage in a memory cell having a specified address. A selected one of the memory cell banks 110 is enabled by an appropriate signal present on its associated selection line (not shown). Furthermore, a selected row of memory cells within that enabled bank 110 is enabled by the generation of an appropriate signal by the row decoder circuit 130 associated with that enabled bank.

The data present on the global write data line 113 is transferred to a local write data line 121 associated with the selected column of memory cells. Thereafter, sense amplifiers contained within the sense amp bands 118 bordering the enabled bank 110 are enabled by a signal present on their associated write column select line 127, as derived by the column decoder circuit 128 associated with the enabled bank. Finally, the data present on the local write data line 121 connected to the selected sense amplifier is transferred to the memory cell having an address identifier corresponding with the selected row and selected column.

Referring now to FIG. 5, a preferred form of array 100 is shown. In this preferred form, a macro 131 includes two memory arrays 132, each of which has a storage capacity of two megabits of data. Accordingly, macro 131 has a storage capacity of four megabytes of data. In this preferred form, each array 132 extends laterally two thousand one hundred eighty (2,180) micrometers and extends longitudinally one thousand three hundred eleven (1,311) micrometers. Each array 132 includes four memory banks 110. Each memory bank 110 includes five hundred sixteen (516) rows and one thousand fifty-six (1,056) columns of memory cells for a total of five hundred forty-four thousand eight hundred and ninety-six (544,896) memory cells per bank.

It will be understood by those skilled in the art that macro 131 is designed to take into account loss of memory cells due to errors or variations occurring during the manufacturing process for the integrated circuit. In particular, this design presumes that there can be up to two column element repairs per array 132 wherein each column element represents sixteen columns. Furthermore, it is presumed that there can be up to one row element repair per bank 110 wherein each row element represents four word lines. Each memory bank 110 has a sense amp band 118 extending along each of its longitudinally extending boundaries. Thus, each array has a total of eight sense amp bands 118, each containing five hundred and twenty-eight (528) sense amplifiers (not shown).

Eight read column select lines 126 and eight write column select lines 127 extend through each sense amp band 118. These read and write column select lines 126, 127 are preferably located in the second metal layer ("2MT") (see FIG. 6B). These column select lines 126, 127 are connected to column decoder circuits 128 positioned in close proximity to the sense amp bands 118.

As shown in FIG. 6A, a longitudinally extending power line 122 and a longitudinally extending ground line 124 also extend through each sense amp band 118. These longitudinally extending power and ground lines 122, 124 are also preferably in the 2MT layer. As further shown therein and as also shown in FIG. 6B, the longitudinally extending power and ground lines 122, 124 are shunted with the laterally extending power and ground lines 114, 116, respectively.

Referring back to FIG. 5, row decoder circuits 130 are positioned along one of the two lateral boundaries of each memory cell bank 110. As will be appreciated, these row decoder circuits 130 enable a particular row of memory cells within its associated memory cell bank 110 during read and write operations.

Each two megabyte array 132 includes one hundred thirty-two (132) global read data lines 112 and one hundred thirty-two (132) global write data lines 113 extending laterally across the memory cell banks 110 (see FIG. 4). The global read data lines 112 and the global write data lines 113 are preferably located in the 3MT layer and are connected to a sixty-four bit register 134. In turn, a sixty-four bit data line 136 connects the sixty-four bit register 134 to a sixteen-to-one data multiplexer 138, which, in turn, is connected to a four bit data line 140 for data transfer with other circuit elements (not shown) included within the electronically controlled apparatus.

In this preferred form, there is no 2MT layer over the memory cell banks 110. Other than the 3MT global data lines 112, 113 and the 3MT power and ground lines 114, 116, the only other layer of metal over the memory cell banks is 1MT. In this preferred case, there are five ties per word line. This architecture provides for global data lines 112, 113 having relatively low capacitance, which increases the performance of circuit 100 and reduces the power consumed thereby.

Referring again to FIG. 6A, the power bussing and ground bussing for each array 132 is illustrated. As shown, sixty-six pairs of laterally extending power lines 114 and laterally extending ground lines 116 are included for powering the circuits included within each array 132. These laterally extending power and ground lines 114, 116 are preferably in the 3MT layer and are preferably three micrometers wide, resulting in a total effective width of one hundred ninety-eight (198) micrometers.

As further shown, one pair of longitudinally extending power lines 122 and longitudinally extending ground lines 124 extends through each sense amp band 118. These longitudinally extending power and ground lines 122, 124 are preferably in the 2MT layer. Each longitudinally extending power and ground line 122, 124 interconnects with all of the respective sixty-six laterally extending power and ground lines 114, 116 to further increase the effective width of the power and ground bussing for array 132. This interconnection is made in the sense amp bands 118. As will be appreciated by those skilled in the art, the design of the power and ground bussing grid reduces power supply and ground noise in the circuit.

Figure 7:
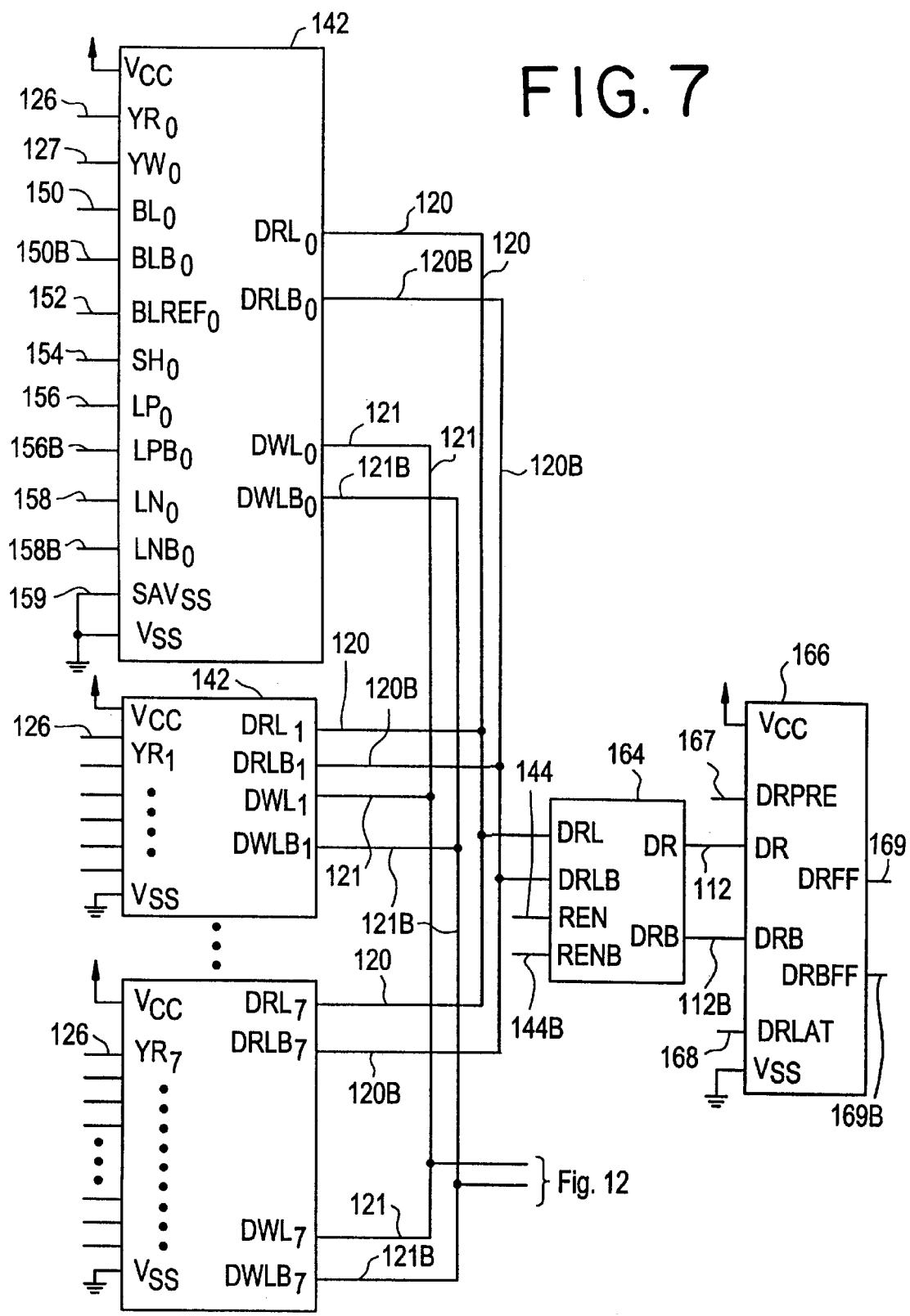
FIG. 7 is a block schematic diagram of the read data path circuitry preferably incorporated in the memory integrated circuit shown in FIG. 4.

In its preferred form, each array 132 further includes local read and write circuitry, which further enhances the performance of the memory circuit and further reduces the power consumed thereby. Referring to FIG. 7, which shows a functional block diagram for the circuit components used in the read data path circuitry, it will be appreciated that the sense amplifiers are grouped together in column units wherein each column unit includes eight sense amplifiers. All of the sense amplifiers in each column unit are included within column circuits 142. For each column unit, there are eight read column select lines (YR0–YR7) 126 that enable a respective one of the eight column circuits 142 within the column unit.

Each sense amplifier within each column unit is included as part of a column circuit 142. Each of the column circuits 142 has several input lines, including the already referenced read column select line (YR) 126, a write column select line (YW) 127, bit lines (BL) 150, (BLB) 150B, a precharge reference line (BLREF) 152, a precharge control line (SH) 154, a latch control line (LP) 156, a latch control line (LPB) 156B, a latch control line (LN) 158, a latch control line (LNB) 158B, a ground line (SAVSS) 159, and a power supply line Vcc.

Each of the column circuits 142 further has two output lines, including a local read data line (DRL) 160, a local read data line (DRLB) 160B and two input lines, namely a local write data line (DWL) 162 and a local write data line (DWLB) 162B.

Local read circuit 164 electrically isolates global read data lines 112, 112B from the local read data lines 120, 120B except for when a read operation is occurring within that particular column unit. While such an operation is occurring, local read circuit 164 connects the global read data lines 112, 112B to the local read data lines 120, 120B. Local read circuit 164 operates under the control of read enable control lines 144, 144B, which are inputs thereto.

The read data path circuitry further includes a data read latch 166. Data read latch 166 has global read data lines 112, 112B, a precharge control line 167 and a latch control line 168 as its inputs. Data read latch 166 further has latched data lines 169, 169B as its outputs.

Still referring to FIG. 7, during a read operation, a read column select line 126 is driven HIGH. The read column select line 126 that is driven HIGH serves as an enable line for the column circuit 142 connected thereto. Prior to the read operation, the bit lines 150, 150B were driven by the data in the accessed memory cell to a slight differential voltage indicative of the stored data. The enabled column circuit 142 receives as an input this differential voltage between bit lines 150, 150B connected thereto. Thereafter, the enabled column circuit 142 amplifies this differential voltage so that one bit line 150, 150B is at the power supply potential (Vcc) and the other bit line 150, 150B is at ground potential (Vss). When the read column select line 126 is driven HIGH, the voltages on the bit lines 150, 150B are transferred to the local read data lines 120, 120B, and then, in turn, applied to local read circuit 164. Local read circuit 164 is enabled by read enable control line 144 and, when enabled, passes the signal present on the local read data lines 120, 120B to global read data lines 112, 112B. When disabled, local read circuit 164 electrically isolates the global read data lines 112, 112B from the local read data lines 120, 120B of this column unit. Because of this isolation, the capacitance on the global read data lines 112, 112B is relatively low, which reduces power consumption by the memory circuit and increases its performance.

After being applied to global read data lines 112, 112B, the signal is then applied to clocked data read latch 166, which amplifies the differential voltage between global read data lines 112, 112B and latches the amplified differential voltage, applying it to latched read data lines 169, 169B. Thereafter, the signal present on the latched read data lines 169, 169B can be transmitted to external circuits for further processing in accordance with the functionality of the electronically controlled apparatus.

Figure 8:
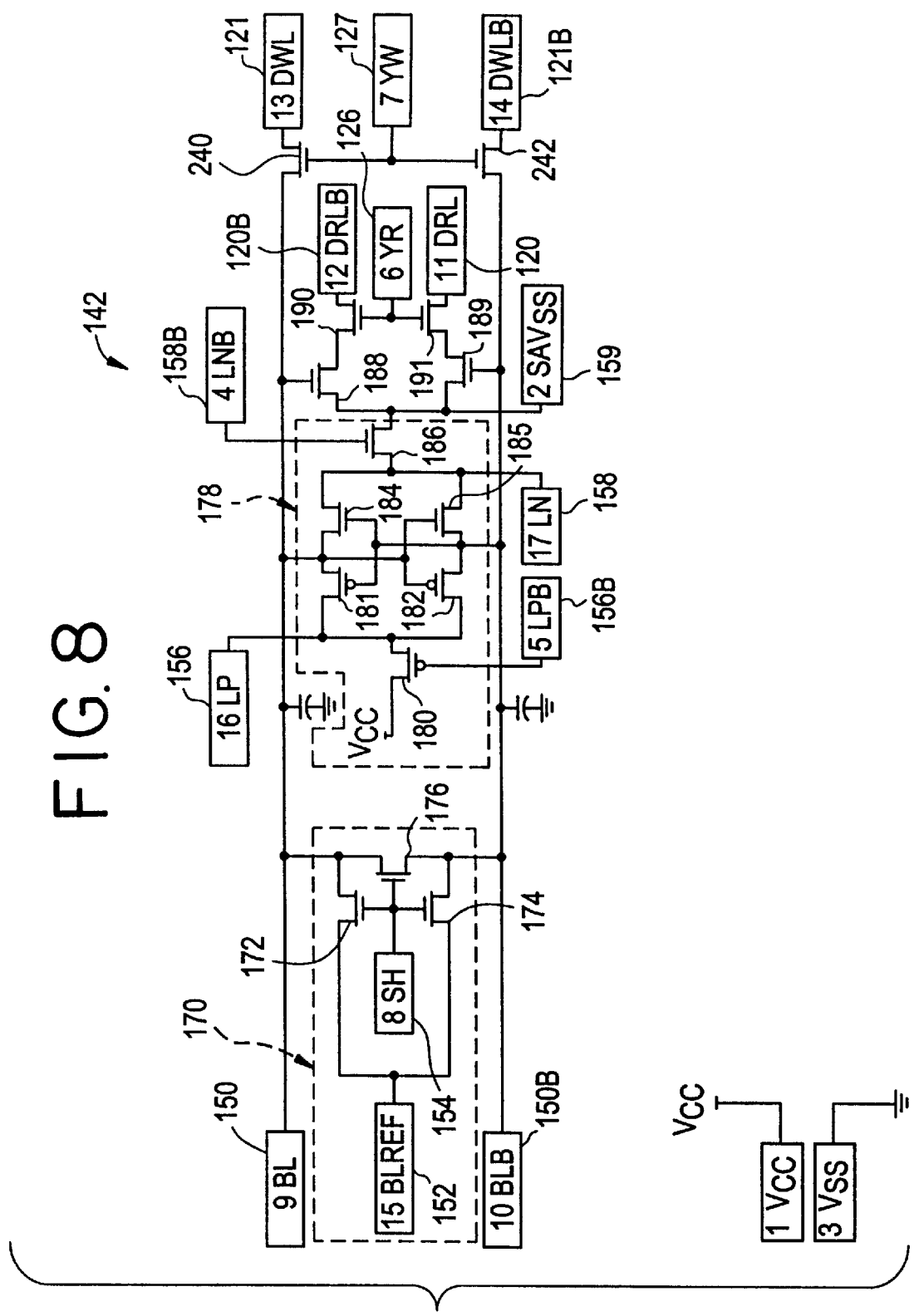
FIG. 8 is a schematic diagram of column circuitry preferably incorporated in the memory integrated circuit shown in FIG. 4.

FIG. 8 illustrates the preferred electronic components included within the column circuits 142 shown in FIG. 7. Aspects of this column circuit are shown and described in European Patent Application EP 0 597 231 A2, published May 18, 1994, the disclosure of which is hereby incorporated herein by reference. Signal generation circuitry for certain aspects of the column circuit is shown and described in U.S. Pat. No. 5,334,890, issued Aug. 2, 1992, the disclosure of which is hereby incorporated herein by reference.

As shown in FIG. 8, bit lines 150, 150B are connected to a precharge and equalizing circuit designated by reference numeral 170. Precharge and equalizing circuit 170 includes two pass transistors 172, 174 and an equalizing transistor 176. Precharge control line 154 is connected to the control (gate) electrodes of pass transistors 172, 174 and to the gate electrode of equalizing transistor 176. Precharge reference line 152, which is preferably set to a voltage level approximately half that of Vcc (Vcc/2), is connected to the drain electrodes of pass transistors 172, 174.

Regarding the functionality of the precharge and equalizing circuit, when a sense operation is not occurring, precharge control line 154 is HIGH and therefore pass transistors 172, 174 and equalizing transistor 176 are all turned ON. As a result, bit lines 150, 150B are precharged to the voltage present on precharge reference line 152. On the other hand, when a sense operation is occurring, precharge control line 154 toggles LOW and turns pass transistors 172, 174 and equalizing transistor 176 OFF. Thereafter, the charge within the accessed memory cell is transferred to bit lines 150, 150B and provides for a differential voltage between those bit lines.

Column circuit 142 further includes a sense amplifier circuit generally designated by reference numeral 178. Sense amplifier circuit 178 includes six transistors, including three P-channel transistors 180–182 and three N-channel transistors 184–186.

Transistor 180 is controlled by latch control line 156B and is turned ON during a sense operation to amplify and drive the appropriate one of bit lines 150, 150B to Vcc. In particular, bit line 150 is driven to Vcc through transistors 180 and 181, or alternatively, bit line 150B is driven to Vcc through transistors 180 and 182. In this regard, bit line 150 is connected to the junction between transistor 181 and transistor 184, which are connected in series, and bit line 150B is connected to the junction between transistor 182 and transistor 185, which are also connected in series.

Transistor 186 is controlled by latch control line 158B and is turned ON during a sense operation to drive one of bit lines 150, 150B to Vss. It will be recalled that ground line 159 is set at Vss. Bit line 150 is driven to Vss through transistors 186 and 184, or alternatively, bit line 150B is driven to Vss through transistors 186 and 185.

P-channel transistors 181, 182 and N-channel transistors 184, 185 form a latch circuit and latch the voltages present at bit lines 150, 150B after one of those lines is driven to Vcc and the other of those lines is driven to Vss during a sense operation. In this regard, bit line 150 is connected to the control (gate) electrodes of transistors 182, 185 and bit line 150B is connected to the gate electrodes of transistors 181, 184.

The column circuit 142 further includes a local read amplifier, includes transistors 188–191, shown illustratively as NMOS devices. Bit line 150 is connected to the control (gate) electrode of transistor 188, while bit line 150B is connected to the gate electrode of pass transistor 189. As shown, the sense column select line 126 for this particular sense amplifier is connected to the gate electrodes of pass transistors 190, 191 to render them conductive during a read operation for that sense amplifier.

Prior to each read operation, and as described below with reference to FIG. 9, local read data lines 120, 120B are equalized. During a read operation, if bit line 150 is driven to Vcc, local read data line 120B is driven to Vss through transistors 188 and 190. Alternatively, if bit line 150B is driven to Vcc, local read data line 120 is driven to Vss through transistors 189 and 191.

Figure 9:
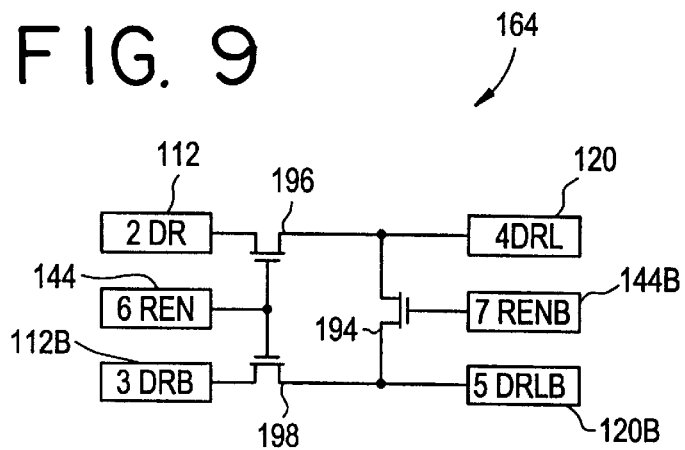
FIG. 9 is a schematic diagram of local read circuitry preferably incorporated in the read data path circuitry of the memory integrated circuit shown in FIG. 4.

FIG. 9 illustrates the preferred electronic components included within the local read circuit 164 shown in FIG. 7. As shown, local read data line 120 is connected to the drain electrodes of an equalizing transistor 194 and a pass transistor 196; local read data line 120B is connected to the source electrode of equalizing transistor 194 and the drain electrode of a pass transistor 198; global read data lines 112, 112B are connected to the source electrodes of pass transistors 196, 198, respectively; read enable control line 144 is connected to the gate electrodes of pass transistors 196, 198; and read enable control line 144B is connected to the gate electrode of equalizing transistor 194. It will be appreciated that local read data lines 120, 120B are shared by eight column circuits 142.

In operation, when the memory circuit is not performing a read function for any of the sense amplifiers within the represented column unit, read enable control line 144 is LOW to render pass transistors 196, 198 nonconductive and thereby isolate local read data lines 120, 120B from global read data lines 112, 112B. At that same time, read enable control line 144B is HIGH to render equalizing transistor 194 conductive, which shorts local read data lines 120, 120B together and equalizes the voltage present on them.

During a read operation, read enable control line 144 goes HIGH and read enable control line 144B goes LOW. Under such circumstances, pass transistors 196, 198 are rendered conductive, and equalizing transistor 194 is rendered nonconductive. This permits one of local read data lines 120, 120B to be driven to Vss as described above with reference to the column circuitry shown in FIG. 8.

Figure 10:
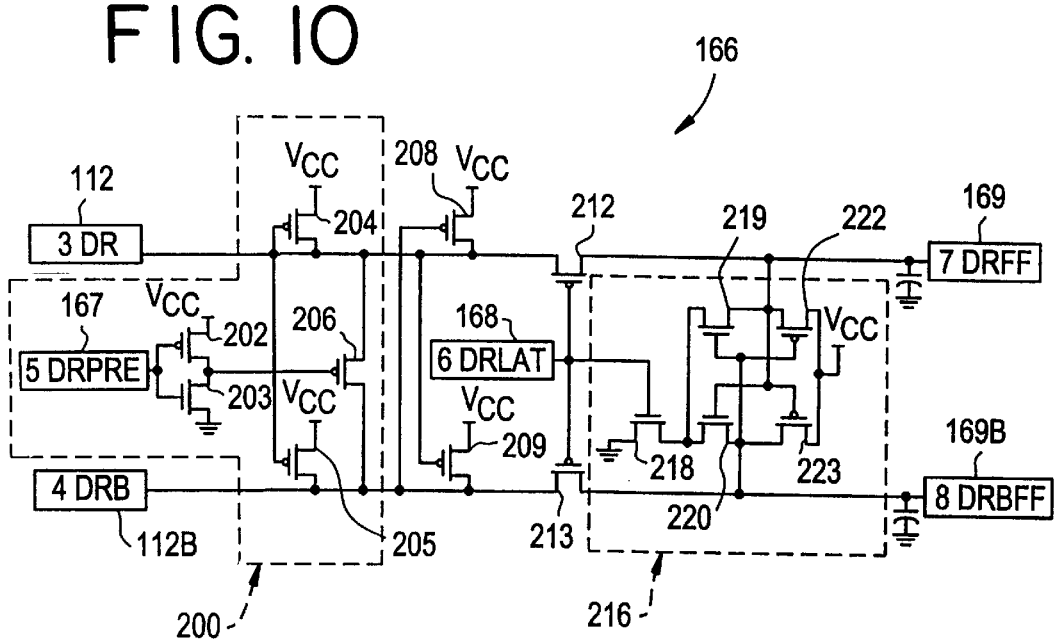
FIG. 10 is a schematic diagram of read data latch circuitry preferably incorporated in the read data path circuitry of the memory integrated circuit shown in FIG. 4.

FIG. 10 illustrates the preferred electronic components included within the data read latch 166 shown in FIG. 7. This circuit and a related circuit are shown and described in U.S. Provisional Application No. 60/185,300, filed Feb. 28, 2000, naming Kim Carver Hardee and John D. Heightley as inventors, the disclosure of which is hereby incorporated herein by reference.

Data read latch 166 is designed to amplify the differential voltage between global read data line 112 and global read data line 112B during a read operation and to latch the signal for subsequent processing by external circuits. It will be appreciated that data read latch 166 might be external to the memory circuit, though this is not necessarily the case.

Data read latch 166 includes a precharge circuit 200 preferably having four driver transistors 202–205 and an equalizing transistor 206. Precharge circuit 200 is controlled by precharge control line 167. As will be appreciated, precharge circuit 200 functions to pull global data line 112 and global data line 112B HIGH prior to a read operation. During a read operation, precharge control line 167 toggles LOW, thereby disabling precharge circuit 200. Data read latch 166 further includes driver transistors 208–209 that function to hold one of the global read data lines 112, 112B HIGH, while the other global read data line 112, 112B is driven LOW. Driver transistors 208, 209 are shown illustratively as PMOS devices.

In addition to the foregoing, data read latch 166 includes a pair of pass transistors 212, 213, which are shown illustratively as PMOS devices. Pass transistor 212 is connected in series between global data line 112 and latched read data line 169. Pass transistor 213 is connected in series between global read data line 112B and latched read data line 169B. Pass transistors 212, 213 are controlled by latch control line 168 and are conductive during the latch cycle to pass the amplified differential voltage signal between global data lines 112, 112B to the latched read data lines 169, 169B.

Data read latch 166 further includes a latch circuit 216 having N-channel transistors 218–220 and P-channel transistors 222, 223. Latch circuit 216 is controlled by latch control line 168. The design of latch circuit 216 is similar to the latch included within the sense amplifier in the column circuit 142 (see FIG. 8). While latch control line 168 enables latch circuit 216, the differential voltage between latched read data line 169 and latched read data line 169B is amplified with one line held at Vcc potential and the other line held at Vss potential.

Figure 11:
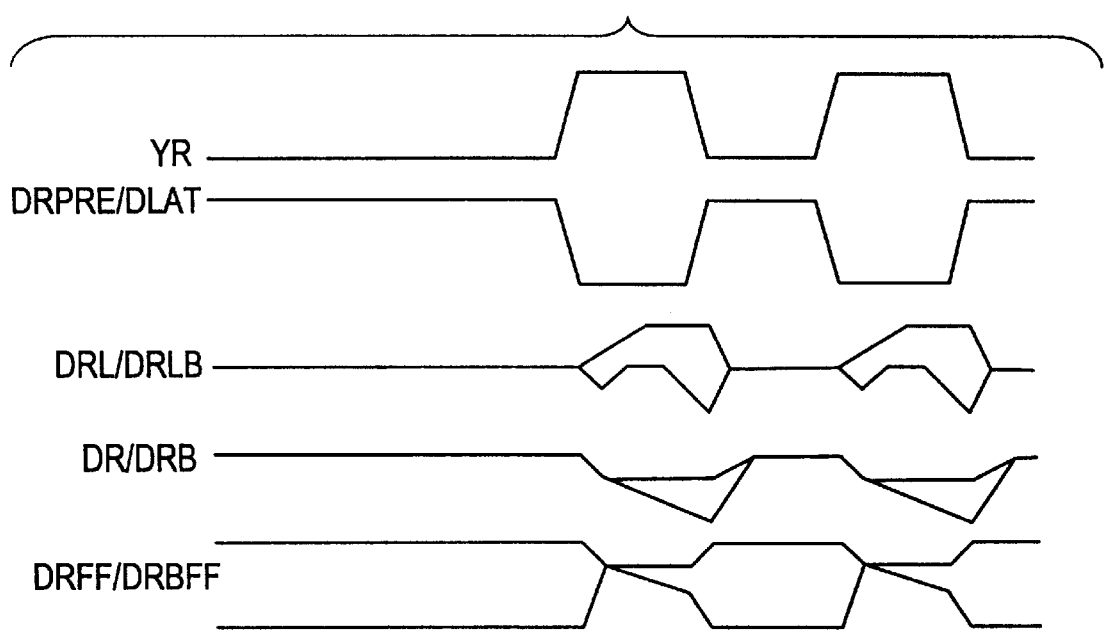
FIG. 11 is a timing diagram showing the preferred timing scheme for signals on particular lines of the read data path circuitry shown in FIG. 7.

Referring to FIG. 11, the timing scheme for signals on certain lines depicted in FIG. 7 is shown. While a read operation is not occurring, the signal (YR) on read column select line 126 is LOW, the signal (DPRE) on precharge control line 167 and the signal (DRLAT) on latch control line 168 are HIGH, the signals (DRL, DRLB) on local data read lines 160, 160B are equalized and floating, the signals (DR, DRB) on global data read lines 112, 112B are precharged to Vcc potential, and the signals (DRFF, DRBFF) on the latched read data lines 169, 169B are held at their previous states. Upon the occurrence of a read operation, YR goes HIGH to initiate a read operation for the column associated with the read column select line 126 illustrated in FIG. 11. Simultaneously, REN goes HIGH and RENB, DRPRE and DRLAT go LOW. In response to the read operation, a differential voltage indicative of the data stored in the selected column circuit 142 is applied to the local read data lines 120, 120B and that differential signal is propagated to the global data lines 112, 112B. The data read latch (see FIG. 10) amplifies the differential voltage present across the global data lines 112, 112B and latches that signal across the latched read data lines 169, 169B.

Figure 12:
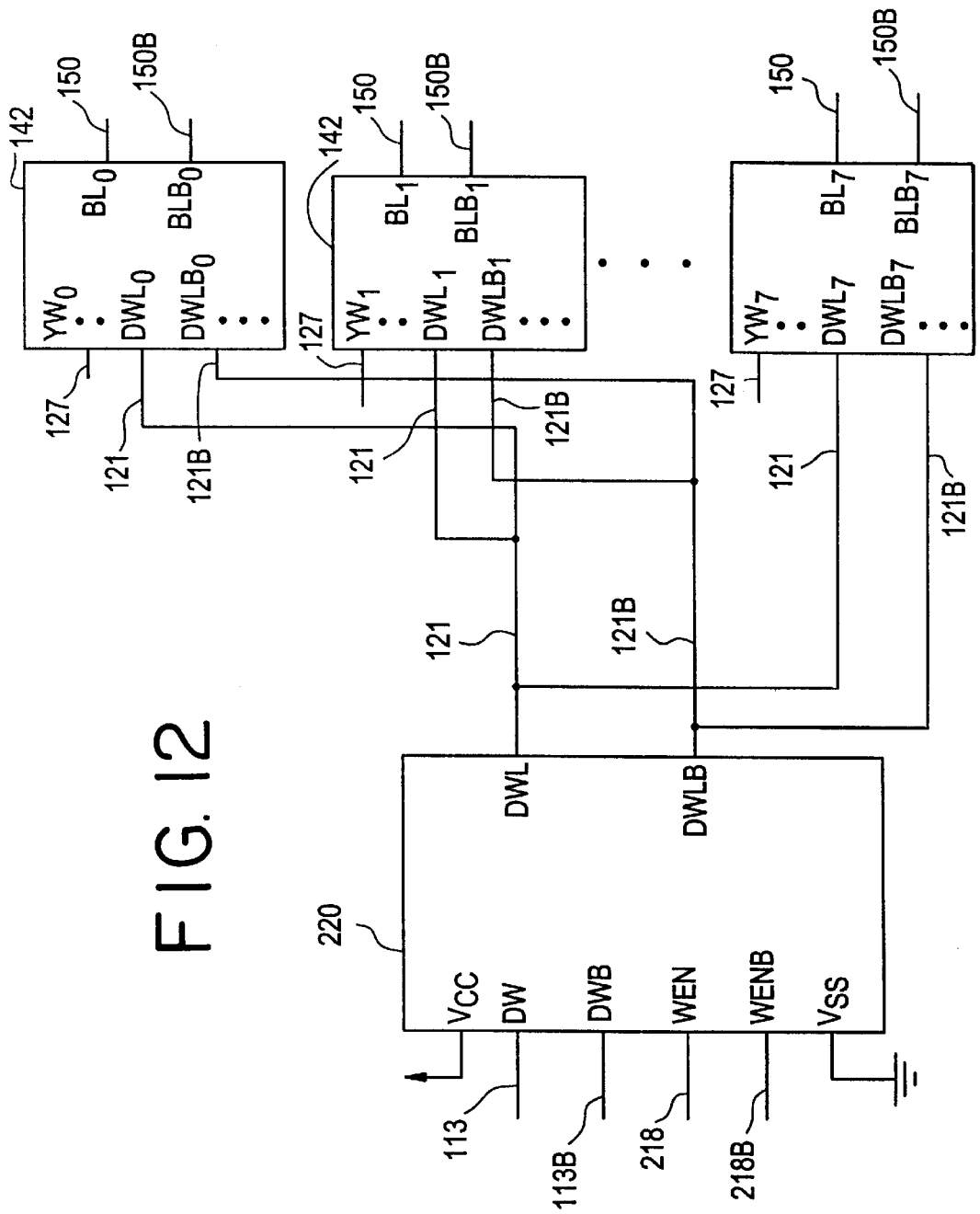
FIG. 12 is a block schematic diagram of the write data path circuitry preferably incorporated in the memory integrated circuit shown in FIG. 4.

Referring now to FIG. 12 and the write data path circuitry, the architecture for such circuitry preferably limits the capacitance of the global write data lines 113, 113B to increase writing speed and decrease the power requirements of the memory circuit. As shown in FIG. 12, global write data lines 113, 113B and write enable control lines 218, 218B are inputs for a local write circuit 220. The outputs of local write circuit 220 are local write data lines 121, 121B, which are shared by eight column circuits 142 having bit lines 150, 1SOB as outputs.

The local write circuit 220 isolates the global write data lines 113, 113B from the local write data lines 121, 121B when a write operation is not taking place within the column unit. When a write operation is occurring in the column unit, the local write circuit drives the local write data lines 121, 121B to Vcc minus the transistor threshold voltage (Vtn) and Vss, as desired. The isolation of the global write data lines 113, 113B from the local write data lines 121, 121B reduces the capacitance of the global write data lines. Further, by driving the local write data lines 121, 121B during a write operation, rather than merely passing the signal, the local write circuit 220 improves the performance of the array 100 during a write operation by providing faster writing.

There are eight write column select lines 127 that enable corresponding column circuits 142. As a result, the differential signal driven onto local write data lines 121, 121B by local write circuit 220 is propagated to the appropriate memory cell for storage therein.

Figure 13A:
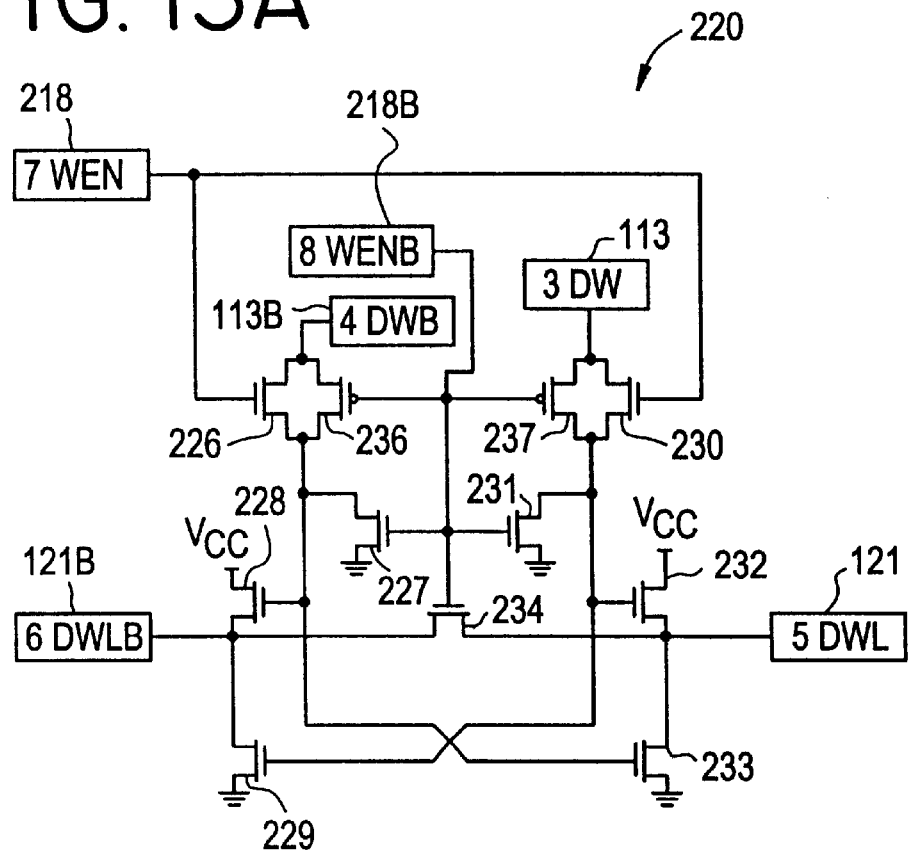
FIG. 13A is a schematic diagram of local write circuitry preferably incorporated in the write data path circuitry of the memory integrated circuit of FIG. 4.

FIG. 13A illustrates the preferred electronic components included in local write circuit 220 (see FIG. 12). As shown, local write circuit 220 preferably includes several transistors, including N-channel transistors 226–234 and P-channel transistors 236–237. When a write operation is not occurring in the column unit associated with local write circuit 220, write enable control line 218 goes LOW and write enable control line 218B goes HIGH. As a result, write enable control line 218 turns pass transistors 226, 230 OFF. Simultaneously, write enable control line 218B turns pass transistors 236, 237 OFF, which prevents the signals present on global write data lines 113, 113B from passing. A HIGH signal on write enable control line 218B also turns equalizing transistor 234 ON, which limits the differential voltage between local write data lines 121,121B. Furthermore, that HIGH signal on write enable control line 218B turns sinking (pull-down) transistors 227, 231 ON, which then turn driver circuit sourcing (pull-up) transistors 228, 232 OFF and turn driver circuit sinking (pull-down) transistors 229, 233 OFF.

During a write operation for the column unit associated with the local write circuit 220, the write enable control line 218 goes HIGH and line 218B goes LOW. As a result, pass transistors 226, 230 and pass transistors 236, 237 are all turned ON to allow the data present on global write data line 113 and global write data line 113B to pass. In particular, pass transistors 226, 230 are turned ON by write enable control line 218 and pass transistors 236, 237 are turned ON by write enable control line 218B. Write enable control line 218B also turns sinking transistors 227, 231 and equalizing transistor 234 OFF to inhibit their functionality during a write operation.

After the signal on global write data line 113 passes through pass transistors 226, 236 and the signal on global write data line 113B passes through pass transistors 230, 237, two alternative circumstances will occur. If global write data line 113 is HIGH and global write data line 113B is LOW, then sourcing transistor 232 and sinking transistor 229 of the driver circuit are turned ON, while sourcing transistor 228 and sinking transistor 233 are turned OFF. Under these circumstances, local write data line 121 is driven HIGH to Vcc-Vtn and local write data line 121B is driven LOW to Vss.

If, alternatively, global write data line 113 is LOW and global write data line 113B is HIGH, then sourcing transistor 228 and sinking transistor 233 of the driver circuit are turned ON, while sourcing transistor 232 and sinking transistor 229 are turned OFF. Under these alternative circumstances, local write data line 121B is driven HIGH to Vcc-Vtn and local write data line 121 is driven LOW to Vss.

Figure 13B:
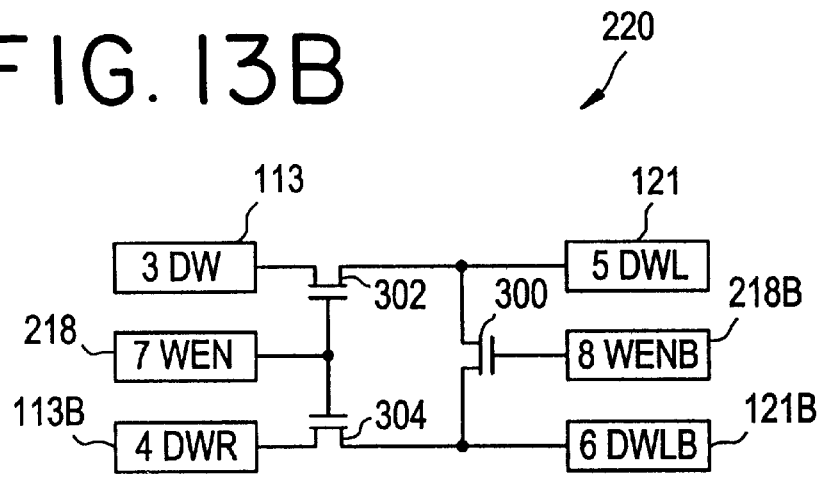
FIG. 13B is a schematic diagram of a simpler, but less preferred, embodiment of the local write circuitry incorporated in the write data path circuitry of the memory integrated circuit of FIG. 4.

Referring now to FIG. 13B, an alternative embodiment for the electronic components included in local write circuit 220 (see FIG. 12) is shown. As shown, local write data line 121 is connected to the drain electrodes of an equalizing transistor 300 and a pass transistor 302; local write data line 121B is connected to the source electrode of equalizing transistor 300 and the drain electrode of a pass transistor 304; global write data lines 113, 113B are connected to the source electrodes of pass transistors 302, 304, respectively; write enable control line 218 is connected to the gate electrodes of pass transistors 302, 304; and write enable control line 218B is connected to the gate electrode of equalizing transistor 300. It will be appreciated that local write data lines 121, 121B are shared by eight (8) column circuits 142.

In operation, when the memory circuit is not performing a write function to any of the sense amplifiers within the represented column unit, write enable control line 218 is LOW to render pass transistors 302, 304 nonconductive and thereby isolate global write data lines 113, 113B from local write data lines 121, 121B. At that same time, write enable control line 218B is HIGH to render equalizing transistor 300 conductive, which shorts local write data lines 121, 121B together and equalizes the voltage present on them.

During a write operation, write enable control line 218 goes HIGH and write enable control 218B goes LOW. Under such circumstances, pass transistors 302, 304 are rendered conductive, and equalizing transistor 300 is rendered nonconductive. This permits the signal present on global write data line 113 to pass to local write data line 121, and also permits the signal on global write data line 113B to pass to local write data line 121B.

As will be appreciated by those skilled in the art, the preferred circuitry for local write circuit 220 is as shown in FIG. 13A because that circuitry drives the local write data lines 120, 120B, which results in faster operation of the write operation in a memory circuit.

Referring back to FIG. 8, in the column circuits 142, pass transistors 240, 242 are connected between local write data lines 121, 121B and bit lines 150, 150B. Write column select line 127 is connected to the gate electrodes of pass transistors 240, 242 to enable the signals present on local write data lines 121, 121B to pass to bit lines 150, 150B during a write operation in that sense amplifier. It will be appreciated that eight column circuits share the local write data lines 121, 121B in this preferred embodiment.

Given the array architecture, it will be appreciated that the performance of the chip might be limited during a write operation due to a potential skew between the timing of the data signal written to a particular memory cell and the address signal present on a write column select line 127. As described above, the address signal present on write column select line 127 enables the sense amplifier associated with that memory cell. Referring back to FIG. 4, it will be recalled that the global write data lines 113, 113B extend laterally across the memory cell banks 110 and that the column select lines 126, 127 extend longitudinally through the sense amp bands 118. Accordingly, it is possible that the distances traveled by signals on those lines might be appreciably different and any consequential skew in the timing of those signals would limit performance of the circuit, particularly here where the memory circuit is high speed. The performance of the circuit is limited because the write operation can only properly occur during the time overlap when the write enable control lines 218, 218B and the write column select line 127 are active and the data on the data lines is valid.

Figure 14:
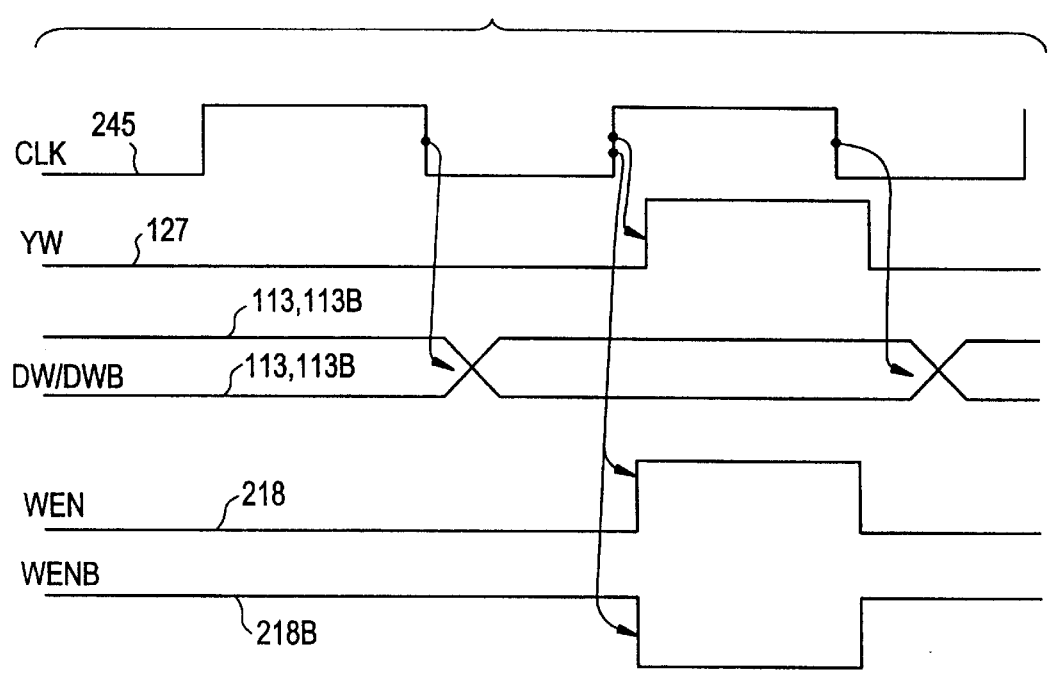
FIG. 14 is a timing diagram showing a preferred timing scheme for writing data to the storage locations included in the memory integrated circuit of FIG. 4.

Referring to FIG. 14, in a preferred timing scheme for write operations, global write data lines 113, 113B are responsive to the negative edge of a clock signal 245, while write enable control lines 218, 218B and write column select line 127 are responsive to the positive edge of the clock signal. This timing scheme relaxes the timing sensitivity during a writing operation. In particular, the timing is no longer dependent on the global write data lines 113, 113B. Rather, the critical timing is only between write column select line 127 and write enable control lines 218, 218B. Because the signals on those lines are generated locally in the same area of the array and because those lines all extend longitudinally through the sense amp band 118, any timing skew is minimal. It will be appreciated that this preferred timing scheme is feasible because the duty cycle of clock 245 preferably is close to fifty percent, most preferably within five percent thereof.

Figure 17A:
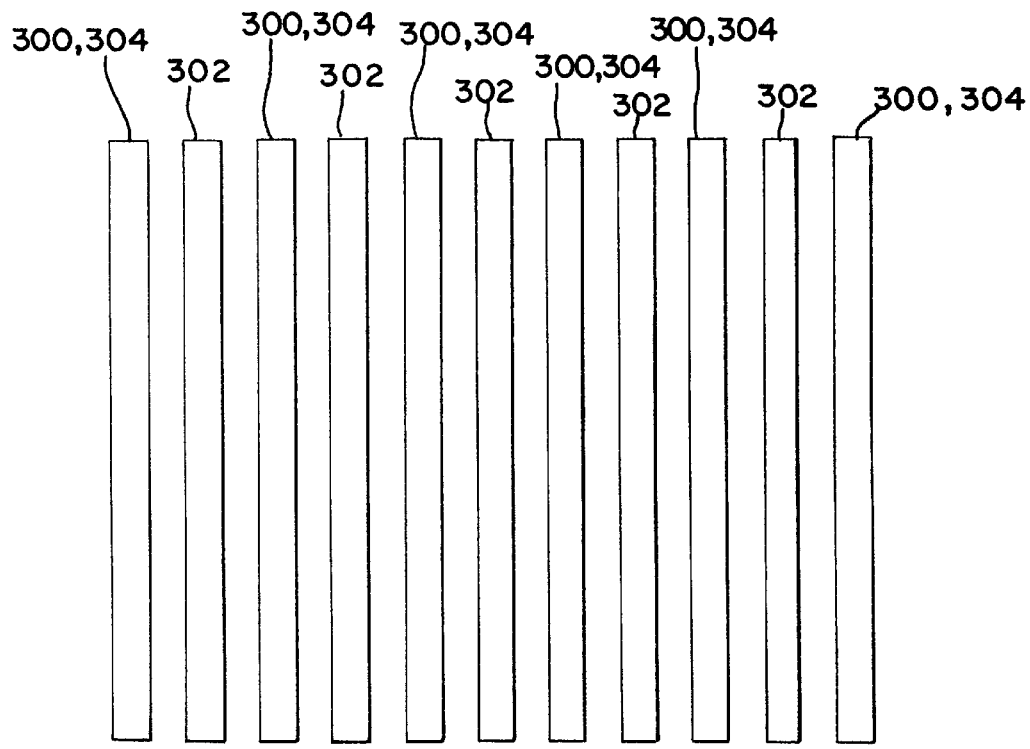
FIG. 17A is a diagrammatic top view of a layout for generally parallel signal conductors included within an integrated circuit according to the principles of the present invention.
Figure 17B:
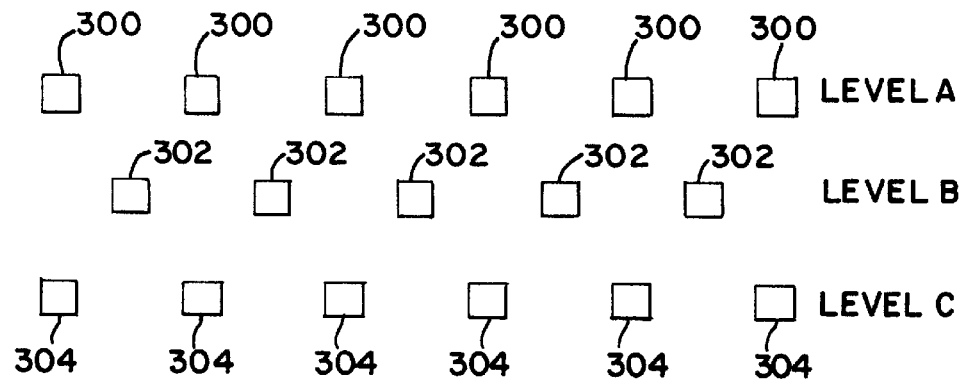
FIG. 17B is a diagrammatic cut away end view of the layout for generally parallel signal conductors included within an integrated circuit shown in FIG. 17A.

FIGS. 17A and 17B illustrate a preferred layout for generally parallel signal conductors included within an integrated circuit. In this depicted layout, a first set of generally parallel signal conductors 300 is included within a first level designated A, a second set of generally parallel signal conductors 302 is included within a second level designated B, and a third set of generally parallel signal conductors 304 is included within a third level designated C. As shown, the conductors 300, 302, 304 are interleaved on different levels. As will be appreciated by those skilled in the art, the layout illustrated in FIGS. 17A and 17B is generally efficient in that several levels A, B, C are used for the generally parallel signal conductors to reduce the lateral dimension requirements.

Because the signal conductors are staggered with respect to each other, in other words because they are not coincident and vertically overlapping, the layout illustrated in FIGS. 17A and 17B yields a substantially reduced line capacitance for the signal conductors. As shown, in a preferred layout, the staggering lines on adjacent levels are offset in such a manner that they are centered between two adjacent conductors on the adjacent above and below levels. This provides for the least amount of vertical line capacitance for this layout in that no vertical parallel plate capacitance exists, and only vertical fringe capacitance exists. Inasmuch as vertical parallel plate capacitance would be the dominant component of vertical line capacitance in layouts such as that depicted in FIGS. 16A and 16B, the layout illustrated in FIGS. 17A and 17B provides for substantially reduced line capacitance to permit increased performance. It will be appreciated by those skilled in the art that with respect to the layout illustrated in FIGS. 17A and 17B, some lateral parallel plate capacitance and lateral fringe capacitance exists.

Figure 18A:
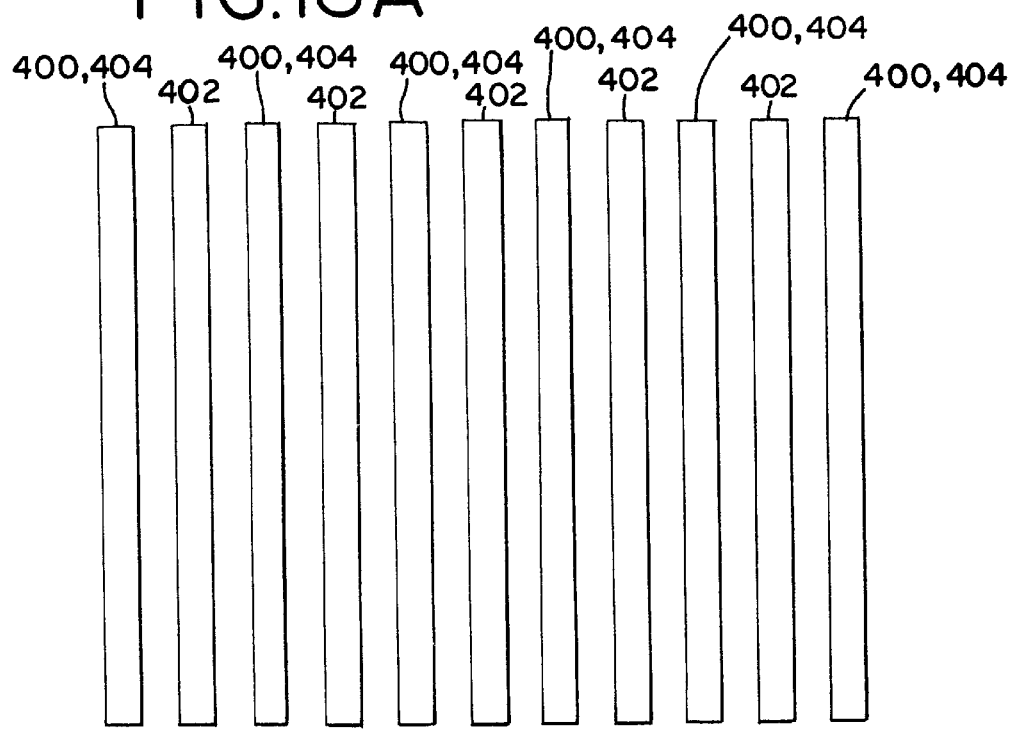
FIG. 18A is a diagrammatic top view of another layout for generally parallel signal conductors included within an integrated circuit according to the principles of the present invention.
Figure 18B:
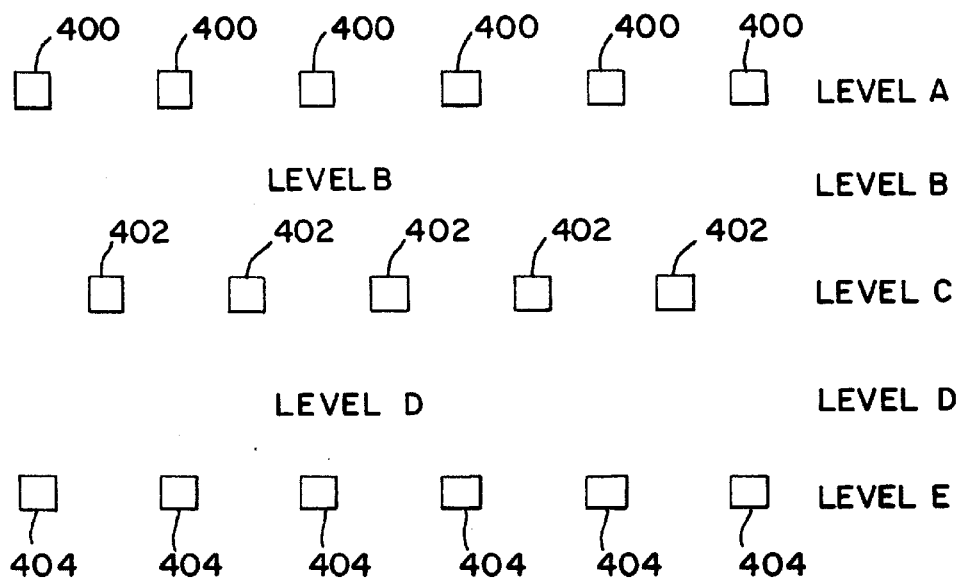
FIG. 18B is a diagrammatic cut away end view of the layout for generally parallel signal conductors included within an integrated circuit shown in FIG. 18A.

FIGS. 18A and 18B illustrate another preferred layout for generally parallel signal conductors included within an integrated circuit. In this depicted layout, a first set of generally parallel signal conductors 400 is included within a first level designated A, no conductors are present within a second level designated B, a second set of generally parallel signal conductors 402 is included within a third level designated C, no conductors are present within a fourth level designated D, and a third set of generally parallel signal conductors 404 is included within a fifth level designated E. As shown, the conductors 400, 402, 404 are interleaved on alternate levels. As will be appreciated by those skilled in the art, the layout illustrated in FIGS. 18A and 18B is not as efficient as the layout illustrated in FIGS. 17A and 17B because conductors do not extend within every level. However, the layout illustrated in FIGS. 18A and 18B does use several levels A, C, E for the generally parallel signal conductors to reduce the lateral dimension requirements.

Because the signal conductors are staggered with respect to each other on alternate levels such that they are not coincident and vertically overlapping, the layout illustrated in FIGS. 18A and 18B yields a substantially reduced line capacitance for the signal conductors. As shown, in a preferred layout, the staggering lines on alternate levels are offset in such a manner that they are centered between two adjacent conductors on the levels closest thereto that have signal conductors. This provides for the least amount of vertical capacitance for this layout in that no vertical parallel plate capacitance exists, and only a slight vertical fringe capacitance exists.

In this preferred layout wherein alternate levels are used for signal conductors, the vertical fringe capacitance component is substantially reduced. It will be appreciated that additional levels (not shown) could be positioned in between those levels that have signal conductors (level A, level C, and level E). This would further reduce the vertical fringe capacitance component to further improve performance, but would be less efficient. Furthermore, it will be appreciated that those levels having no conductors could actually just be intelligently minimized. It will be appreciated by those skilled in the art that with respect to the layout illustrated in FIGS. 18A and 18B, some lateral parallel plate capacitance and lateral fringe capacitance exists.

While this invention has been described with reference to certain illustrative embodiments, it will be understood that this description shall not be construed in a limiting sense. Rather, various changes and modifications can be made to the illustrative embodiments without departing from the true spirit and scope of the invention, as defined by the following claims. For example, any material can be used for the signal line conductors shown in FIGS. 17–18. Furthermore, it will be appreciated that any such changes and modifications would be recognized by those skilled in the art as an equivalent to one element or more of the following claims, and shall be covered by such claims to the fullest extent permitted by law.

What is claimed is:

1. An integrated circuit having a plurality of levels, comprising:
    a first signal conductor extending within a first level of said integrated circuit;
    a second signal conductor extending within said first level of said integrated circuit adjacent and in close proximity to said first signal conductor; and
    a third signal conductor extending within a second level of said integrated circuit adjacent to said first level of said integrated circuit, said third conductor being positioned laterally between said first and second conductors.

2. The integrated circuit as defined by claim 1 wherein said third signal conductor is positioned generally centrally laterally between said first and second conductors.

3. The integrated circuit as defined by claim 1 wherein said third signal conductor is centered laterally between said first and second conductors.

4. An integrated circuit having a plurality of levels, comprising:
    a plurality of first level signal conductors extending within a first level of said integrated circuit;
    a plurality of second level signal conductors extending within a second level of said integrated circuit adjacent to said first level of said integrated circuit; and
    wherein at least one of said second level signal conductors is positioned laterally between two adjacent ones of said first level signal conductors.

5. The integrated circuit as defined by claim 4 wherein at least half of said second level signal conductors are positioned laterally between sets of adjacent ones of said first level signal conductors.

6. The integrated circuit as defined by claim 4 wherein at least all but two of said second level signal conductors are positioned laterally between sets of adjacent ones of said first level signal conductors.

7. The integrated circuit as defined by claim 4 wherein all of said second level signal conductors are positioned laterally between sets of adjacent ones of said first level signal conductors.

8. The integrated circuit as defined by claim 4 wherein said at least one of said second level signal conductors is positioned generally centrally laterally between said two adjacent ones of said first level signal conductors.

9. The integrated circuit as defined by claim 4 wherein said at least one of said second level signal conductors is centered laterally between said two adjacent ones of said first level signal conductors.

10. The integrated circuit as defined by claim 4 wherein at least half of said second level signal conductors are positioned generally centrally laterally between sets of adjacent ones of said first level signal conductors.

11. The integrated circuit as defined by claim 4 wherein at least half of said second level signal conductors are centered laterally between sets of adjacent ones of said first level signal conductors.

12. The integrated circuit as defined by claim 4 wherein at least all but two of said second level signal conductors are positioned generally centrally laterally between sets of adjacent ones of said first level signal conductors.

13. The integrated circuit as defined by claim 4 wherein at least all but two of said second level signal conductors are centered laterally between sets of adjacent ones of said first level signal conductors.

14. The integrated circuit as defined by claim 4 wherein all of said second level signal conductors are positioned generally centrally laterally between sets of adjacent ones of said first level signal conductors.

15. The integrated circuit as defined by claim 4 wherein all of said second level signal conductors are centered laterally between sets of adjacent ones of said first level signal conductors.

16. An integrated circuit having a plurality of levels, comprising:
    a first level;
    a first signal conductor extending within said first level;
    a second signal conductor extending within said first level positioned adjacent and in close proximity to said first signal conductor;
    a second level adjacent to said first level having no signal conductors extending within it in the vicinity of said first and second signal conductors;
    a third level adjacent to said second level and positioned opposite said first level; and
    a third signal conductor extending within said third level positioned laterally between said first and second conductors.

17. The integrated circuit as defined by claim 16 wherein said third signal conductor is positioned generally centrally laterally between said first and second conductors.

18. The integrated circuit as defined by claim 16 wherein said third signal conductor is centered laterally between said first and second conductors.

19. An integrated circuit having a plurality of levels, comprising:

a first level;

a plurality of first level signal conductors extending within said first level;

a second level adjacent to said first level having no signal conductors extending within it in the vicinity of said plurality of first level signal conductors;

a third level adjacent to said second level and positioned opposite said first level;

a plurality of third level signal conductors extending within said third level; and wherein at least one of said third level signal conductors is positioned laterally between two adjacent ones of said first level signal conductors.

20. The integrated circuit as defined by claim 19 wherein at least half of said third level signal conductors are positioned laterally between sets of adjacent ones of said first level signal conductors.

21. The integrated circuit as defined by claim 19 wherein at least all but two of said third level signal conductors are positioned laterally between sets of adjacent ones of said first level signal conductors.

22. The integrated circuit as defined by claim 19 wherein all of said third level signal conductors are positioned laterally between sets of adjacent ones of said first level signal conductors.

23. The integrated circuit as defined by claim 19 wherein said at least one of said third level signal conductors is positioned generally centrally laterally between said two adjacent ones of said first level signal conductors.

24. The integrated circuit as defined by claim 19 wherein said at least one of said third level signal conductors is centered laterally between said two adjacent ones of said first level signal conductors.

25. The integrated circuit as defined by claim 19 wherein at least half of said third level signal conductors are positioned generally centrally laterally between sets of adjacent ones of said first level signal conductors.

26. The integrated circuit as defined by claim 19 wherein at least half of said third level signal conductors are centered laterally between sets of adjacent ones of said first level signal conductors.

27. The integrated circuit as defined by claim 19 wherein at least all but two of said third level signal conductors are positioned generally centrally laterally between sets of adjacent ones of said first level signal conductors.

28. The integrated circuit as defined by claim 19 wherein at least all but two of said third level signal conductors are centered laterally between sets of adjacent ones of said first level signal conductors.

29. The integrated circuit as defined by claim 19 wherein all of said third level signal conductors are positioned generally centrally laterally between sets of adjacent ones of said first level signal conductors.

30. The integrated circuit as defined by claim 19 wherein all of said third level signal conductors are centered laterally between sets of adjacent ones of said first level signal conductors.

* * * * *